United States Patent [19]
Kishimura

[11] Patent Number: 5,885,754
[45] Date of Patent: Mar. 23, 1999

[54] METHOD OF FORMING A PATTERN

[75] Inventor: Shinji Kishimura, Hyogo, Japan

[73] Assignee: Mitsubishi Denki Kabushiki Kaisha, Tokyo, Japan

[21] Appl. No.: 736,174

[22] Filed: Oct. 23, 1996

[30] Foreign Application Priority Data

May 17, 1996 [JP] Japan ................................. 8-123561

[51] Int. Cl.$^6$ ........................................ G03F 7/38
[52] U.S. Cl. .................. 430/325; 430/323; 430/330
[58] Field of Search ............................. 430/311, 313, 430/314, 315, 322, 323, 324, 325, 326, 330

[56] References Cited

U.S. PATENT DOCUMENTS

| | | | |
|---|---|---|---|
| 4,690,838 | 9/1987 | Hiraoka | 427/343 |
| 5,356,758 | 10/1994 | Orvek | 430/322 |
| 5,487,967 | 1/1996 | Hutton | 430/322 |
| 5,550,007 | 8/1996 | Taylor | 430/314 |

FOREIGN PATENT DOCUMENTS

| | | |
|---|---|---|
| 63-187237 | 8/1988 | Japan . |
| 2-160244 | 6/1990 | Japan . |
| 3-188447 | 8/1991 | Japan . |
| 4-301646 | 10/1992 | Japan . |
| 6-35201 | 2/1994 | Japan . |

OTHER PUBLICATIONS

David R. Wheeler, et al: "New Silicon–Rich Silylating Reagents for Dry–Developed Positive–Tone Deep–Ultraviolet Lithography ", *J. Vac. Sci. Technol.*, B. 11(6), Nov./Dec. 1993 American Vacuum Society, pp. 2789–2793.

R.S. Hutton, et al: "Positive–Tone Silylated, Dry–Developed, Deep Ultraviolet Resist with 0.2 p, Resolution", *J. Vac. Sci. Technol.* B 12(6), Nov./Dec. 1994, 1994 American Vacuum Society, pp. 3919–3924.

Richard S. Hutton, et al: "Plasma Development of a Silylated Bilayer Resist: Effects of etch Chemistry on Critical Dimension Control and Feature Profiles", *J. Vac. Sci. Technol.* B 13(6), Nov./Dec. 1995, 1995 American Vacuum Society, pp. 2366–2371.

David Wheeler: "Aminodisilanes as Silylating Agents for Dry–Developed Positive–Tone Resists for Deep Ultraviolet (248nm) and Extreme Ultraviolet (13.5nm) Microlithography", *SPIE*, vol. 2438, pp .762–774.

Gary N. Taylor: "Extreme UV Resist Technology: The Limits of Silylated Resist Resolution", *SPIE*, vol. 2437, pp. 308–330.

F. Coopmans, et al: "Desire: A New Route to Submicron Optical Lithography", *Solid State Technology*, Jun. 1987, pp. 93–99.

Maaike Op de Beeck, et al: "Silylation of Novolac Based Resists: Influence of Deep–Ultraviolet Induced Crosslinking", *J. Vac. Sci. Technol.* B 10(2), Mar./Apr. 1992, 1992 American Vaccum Society, pp. 701–714.

James W. Thackeray, et al: "Effect of Resin Molecular Weight on the Resolution of DUV Negative Photoresists", *SPIE*, vol. 2195, pp. 152–163.

James Fahey, et al: "A New Positive Tone Deep–UV Photoresist base on Poly(4–hydroxystyrene) and an Acid Labile Protecting Group", *SPIE*, vol. 2438, pp. 125–142.

*Primary Examiner*—Kathleen Duda
*Attorney, Agent, or Firm*—McDermott, Will & Emery

[57] ABSTRACT

A method of forming a pattern includes the steps of forming a first layer by applying an organic material on a layer to be processed, forming a second layer which can be treated with an organic metal reagent and has a thickness in the range from 30 to 100 nm by applying a material which can be treated with an organic metal reagent on the first layer, selectively forming in the second layer a portion which cannot be treated with an organic metal reagent, treating with an organic metal reagent the portion of the second layer which can be treated with an organic metal reagent, and removing the portion which cannot be treated with an organic metal reagent and a portion of the first layer which is located thereunder.

16 Claims, 39 Drawing Sheets

METHOD OF FORMING A PATTERN

BACKGROUND OF THE INVENTION

1. Field of the Invention

The present invention relates to a method of forming a pattern, and more particularly, to a method of forming a fine pattern having a width of at most 0.2 μm by forming two resist layers.

2. Description of the Background Art

In order to process a layer required to be processed, an insulating film, for example, in forming a semiconductor device, a method of forming a resist pattern of a single resist layer and processing an insulating film according to the resist pattern is generally used. In order to process an insulating film having many stepped portions, however, a method of forming a first resist layer as a flattening layer on the insulating film, forming a second resist layer on the first resist layer, and forming a resist pattern in the second resist layer has been often used. The methods disclosed in the following documents (i) to (vii) have been known as such a method of forming a pattern using two resist layers.

(i) J. Vac. Sci. Technol., B11(6), November/December 1993, pp. 2789~2793(1993)

(ii) J. Vac. Sci. Technol., B12(6), November/December 1994, pp. 3919~3924(1994)

(iii) J. Vac. Sci. Technol., B13(6), November/December 1995, p. 2366~2371 (1995)

(iv) SPIE, Vol. 2438, pp. 762~774 (1995)

(v) SPIE, Vol. 2437, pp. 308~330 (1995)

(vi) Japanese Patent Laying-Open No. 3-188447

(vii) Japanese Patent Laying-Open No. 4-301646

The methods disclosed in the documents (i) to (v) will now be described in conjunction with the accompanying drawings.

FIGS. 55 to 60 are cross sectional views showing a conventional method of forming a pattern.

Referring to FIG. 55, a lower resist layer 302 is formed as a flattening layer on a layer 301 to be processed.

Referring to FIG. 56, an upper resist layer 303 is formed on a surface of lower resist layer 302. Since the surface of lower resist layer 302 is flat, upper resist layer 303 has an almost uniform thickness (0.20 to 0.22 μm).

Referring to FIG. 57, light with a wavelength of 248 nm shown by arrows 304 is directed to upper resist layer 303, whereby upper resist layer 303 partially becomes an exposed region 305.

Referring to FIG. 58, upper resist layer 303 and exposed region 305 in FIG. 57 are heated, whereby a layer 306 which cannot be silylated (hereinafter referred to as un-silylatable layer) and a layer 307 which can be silylated (hereinafter referred to as silylatable layer) are formed.

Referring to FIG. 59, un-silylatable layer 306 and silylatable layer 307 in FIG. 58 are made in contact with gas containing silicon atoms, whereby silylatable layer 307 is turned into a silylated layer 308.

Referring to FIG. 60, un-silylatable layer 306 and lower resist layer 302 located thereunder in FIG. 59 are etched with oxygen plasma shown by arrows 310. On the other hand, a surface of silylated layer 308 reacts with oxygen plasma shown by the arrows 310 to be an oxide film 309. This oxide film 309 serves as a shielding film against oxygen plasma. Therefore, silylated layer 308 and lower resist layer 302 located thereunder will not be etched.

A conventional pattern is thus formed.

In recent years, elements constituting a semiconductor device have been miniaturized. In addition, with increase in the integration degree of a semiconductor device, a pattern formed in resist has been required to be so fine as to have a width of at most 0.20 μm. Problems which occur when such a fine pattern is formed by a conventional method will now be described.

FIGS. 61 to 64 are cross sectional views illustrating a conventional method of forming a fine pattern. Referring to FIG. 61, a lower resist layer 302 is formed as a flattening layer on a layer 301 to be processed. An upper resist layer 303 having a thickness in the range from 0.20 to 0.22 μm is formed on lower resist layer 302. Light with a wavelength of 248 nm shown by arrows 304 is directed to a portion of upper resist layer 303, whereby an exposed region 305 is formed. A width ($W_1$ in the figure) of exposed region 305 is at most 0.20 μm. Furthermore, a distance ($W_2$ in the figure) between exposed regions 305 is also at most 0.20 μm.

Referring to FIG. 62, upper resist layer 303 and exposed region 305 in FIG. 61 are heated, whereby an un-silylatable layer 306 and a silylatable layer 307 are formed.

Referring to FIG. 63, un-silylatable layer 306 and silylatable layer 307 in FIG. 62 are made in contact with gas containing silicon atoms, whereby silylatable layer 307 is turned into a silylated layer 308. At this time, silylated layer 308 swells. If a distance between silylated layers 308 is large, swelling of silylated layers 308 will not cause problems. When the distance between silylated layers 308 is at most 0.20 μm, however, silylated layers 308 join with each other as a result of swelling as shown in FIG. 63.

Referring to FIG. 64, since silylated layers 308 join with each other, a portion of lower resist layer 302, which should be etched away, remains unetched, so that a desired pattern cannot be formed.

Furthermore, as shown in FIG. 63, silylated layer 308 is thicker in the center thereof and becomes thinner towards the end thereof as a result of swelling. Therefore, the end of silylated layer 308 might be etched during dry etching by oxygen plasma. The end of silylated layer 308 might not be etched. The size of a pattern in the case where the end of silylated layer 308 is etched is a different from that in the case where the end of silylated layer 308 is not etched on a nanometer order.

If the size of a pattern is large, such an error on a nanometer order will not cause problems, but when a resist pattern having a size of at most 0.20 μm is to be formed, such an error on a nanometer order will cause problems.

In addition, a conventional method of forming a pattern causes other problems. FIG. 65 is a cross sectional view used for illustration of reflection (halation) of light from a stepped portion of a layer to be processed. Referring to FIG. 65, a lower resist layer 302 is formed on a layer 301 to be processed. An upper resist layer 303 is formed on lower resist layer 302. Light shown by arrows 304 in the figure is directed to a portion of upper resist layer 303, whereby an exposed region 305 is formed. At this time, light shown by the arrow 304 is reflected by a stepped portion of layer 301. Therefore, a region 330 which should not be exposed to light is exposed to light, so that a desired pattern cannot be formed.

SUMMARY OF THE INVENTION

It is an object of the present invention to provide a method of forming a resist pattern with high accuracy by preventing swelling of a silylated layer.

It is another object of the present invention to provide a method of forming a resist pattern with high accuracy by preventing reflection of light from a layer to be processed.

A method (I) of forming a pattern according to one aspect of the present invention includes the following steps (i) to (v) of:

(i) forming a first layer by applying an organic material on a layer to be processed;

(ii) forming a second layer having a thickness in the range from 30 to 100 nm by applying a material which can be treated with an organic metal reagent on the first layer, wherein organic metal is metal which has been bonded to carbon and the metal includes silicon;

(iii) selectively forming in the second layer a portion which cannot be treated with an organic metal reagent;

(iv) treating with an organic metal reagent the second layer except the portion which cannot be treated with an organic metal reagent; and (v) removing the portion which cannot be treated with an organic metal reagent and a portion of the first layer which is located thereunder.

Furthermore, in the method (I) of forming a pattern, the above mentioned step of forming in the second layer a portion which cannot be treated with an organic metal reagent preferably includes the steps of selectively directing light to the second layer, and turning a portion of the second layer which has been exposed to the light into a portion which cannot be treated with an organic metal reagent by heating the second layer. In that case, a method (II) of forming a pattern according to another aspect of the present invention includes the following steps (i) to (vi) of:

(i) forming a first layer by applying an organic material on a layer to be processed;

(ii) forming a second layer having a thickness in the range from 30 to 100 nm by applying a material which can be treated with an organic metal reagent on the first layer;

(iii) selectively directing light to the second layer;

(iv) turning a portion of the second layer which has been exposed to the light into a portion which cannot be treated with an organic metal reagent by heating the second layer;

(v) treating with an organic metal reagent the second layer except the portion which cannot be treated with an organic metal reagent; and (vi) removing the portion which cannot be treated with an organic metal reagent and a portion of the first layer which is located thereunder.

The material which can be treated with an organic metal reagent preferably contains active hydrogen. Furthermore, the material which can be treated with an organic metal reagent preferably contains at least one kind selected from the group consisting of an OH group, a COOH group, an NH group and an SH group.

In addition, the above mentioned step of forming the second layer preferably includes the step of forming a protective film which covers a surface of the second layer.

Furthermore, the organic material preferably has light reflectance of at most 5%.

Furthermore, in the method (I) of forming a pattern, the above mentioned step of forming in the second layer a portion which cannot treated with an organic metal reagent preferably includes the step of selectively directing light to the second layer to turn a portion of the second layer which has been exposed to the light into a portion which cannot be treated with an organic metal reagent. In that case, a method (III) of forming a pattern according to still another aspect of the present invention includes the following steps (i) to (v) of:

(i) forming a first layer by applying an organic material on a layer to be processed;

(ii) forming a second layer having a thickness in the range from 30 to 100 nm by applying a material which can be treated with an organic material reagent on the first layer;

(iii) selectively directing light to the second layer to turn a portion of the second layer which has been exposed to the light into a portion which cannot be treated with an organic metal reagent;

(iv) treating with an organic metal reagent the second layer except the portion which cannot be treated with an organic metal reagent; and (v) removing the portion which cannot be treated with an organic metal reagent and a portion of the first layer which is located thereunder.

Furthermore, the above described step of turning the portion of the second layer into a portion which cannot be treated with an organic metal reagent preferably includes the step of directing light to the second layer in inert gas.

The material which can be treated with an organic metal reagent preferably contains active hydrogen. In addition, the material which can be treated with an organic metal reagent preferably contains at least one kind selected from the group consisting of an OH group, a COOH group, an NH group and an SH group.

Furthermore, the intensity of light directed is preferably at least 10 mJ/cm$^2$/pulse, where mJ/cm$^2$/pulse indicates energy per pulse of a laser beam. Furthermore, the material which can be treated with an organic metal reagent preferably has light transmittance of at least 80%.

A method (IV) of forming a pattern according to yet another aspect of the present invention includes the following steps (i) to (v) of:

(i) forming a first layer by applying a first organic material on a layer to be processed;

(ii) forming a second layer having a thickness in the range from 30 to 100 nm by applying a second organic material on the first layer;

(iii) selectively forming in the second layer a portion which can be treated with an organic metal reagent;

(iv) treating with an organic metal reagent the portion which can be treated with an organic metal reagent; and (v) removing the second layer except the portion which can be treated with an organic metal reagent and a portion of the first layer which is located under the second layer except the portion which can be treated with an organic metal reagent.

Furthermore, in the method (IV) of forming a pattern, the above mentioned step of selectively forming in the second layer a portion which can be treated with an organic metal reagent preferably includes the steps of selectively directing light to the second layer to turn a portion of the second layer which has been exposed to the light into a portion which can be treated with an organic metal reagent, and turning the second layer except the portion which can be treated with an organic metal reagent into a portion which cannot be treated with an organic metal reagent by heating the second layer. In that case, a method (V) of forming a pattern according to a further aspect of the present invention includes the following steps (i) to (vi) of:

(i) forming a first layer by applying a first organic material on a layer to be processed;

(ii) forming a second layer having a thickness in the range from 30 to 100 nm by applying a second organic material on the first layer;

(iii) selectively directing light to the second layer to turn a portion of the second layer which has been exposed to the light into a portion which can be treated with an organic metal reagent;

(iv) turning the second layer except the portion which can be treated with an organic metal reagent into a portion which cannot be treated with an organic metal reagent by heating the second layer;

(v) treating with an organic metal reagent the portion which can be treated with an organic metal reagent; and (vi) removing the portion which cannot be treated with an organic metal reagent and a portion of the first layer which is located thereunder.

Furthermore, the above mentioned step of forming the first layer preferably includes the step of solidifying the first organic material by heating the first organic after being applied.

In the method (IV) of forming a pattern, the above mentioned step of selectively forming in the second layer a portion which can be treated with an organic metal reagent preferably includes the steps of selectively directing light to the second layer, and turning a portion of the second layer which has been exposed to the light into a portion which can be treated with an organic metal reagent by heating the second layer. In that case, a method (VI) of forming a pattern according to a still further aspect of the present invention includes the following steps (i) to (vi) of:

(i) forming a first layer by applying a first organic material on a layer to be processed;

(ii) forming a second layer having a thickness in the range from 30 to 100 nm by applying a second organic material on the first layer;

(iii) selectively directing light to the second layer;

(iv) turning a portion of the second layer which has been exposed to the light into a portion which can be treated with an organic metal reagent by heating the second layer;

(v) treating with an organic metal reagent the portion which can be treated with an organic metal reagent; and (vi) removing the second layer except the portion which can be treated with an organic metal reagent and a portion of the first layer which is located under the second layer except the portion which can be treated with an organic metal reagent.

In addition, the above mentioned step of forming the first layer preferably includes the step of solidifying the first organic material by heating the first organic material after being applied.

Furthermore, in the method (IV) of forming a pattern, the above mentioned step of selectively forming in the second layer a portion which can be treated with an organic metal reagent preferably includes the steps of turning the entire second layer into a layer which can be treated with an organic metal reagent, and selectively directing light to the second layer which can be treated with an organic metal reagent to turn a portion of the second layer which has been exposed to the light into a portion which cannot be treated with an organic metal reagent. In that case, a method (VII) of forming a pattern according to a yet further aspect of the present invention includes the following steps (i) to (vi) of:

(i) forming a first layer by applying a first organic material on a layer to be processed;

(ii) forming a second layer having a thickness in the range from 30 to 100 nm by applying a second organic material on the first layer;

(iii) turning the entire second layer into a layer which can be treated with an organic metal reagent;

(iv) selectively directing light to the second layer which can be treated with an organic metal reagent to turn a portion of the second layer which has been exposed to the light into a portion which cannot be treated with an organic metal reagent;

(v) treating with an organic metal reagent the portion of the second layer which can be treated with an organic metal reagent; and (vi) removing the portion which cannot be treated with an organic metal reagent and a portion of the first layer which is located thereunder.

In addition, the above mentioned step of turning a portion of the second layer into a portion which cannot be treated with an organic metal reagent preferably includes the step of selectively directing light to the second layer in inert gas.

Furthermore, the above mentioned step of forming the first layer preferably includes the step of solidifying the first organic material by heating the first organic material after being applied. In addition, the above mentioned step of turning the entire second layer into a layer which can be treated with an organic metal reagent preferably includes the step of directing ultraviolet rays to the entire second layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

(First Embodiment)

Figure 1:
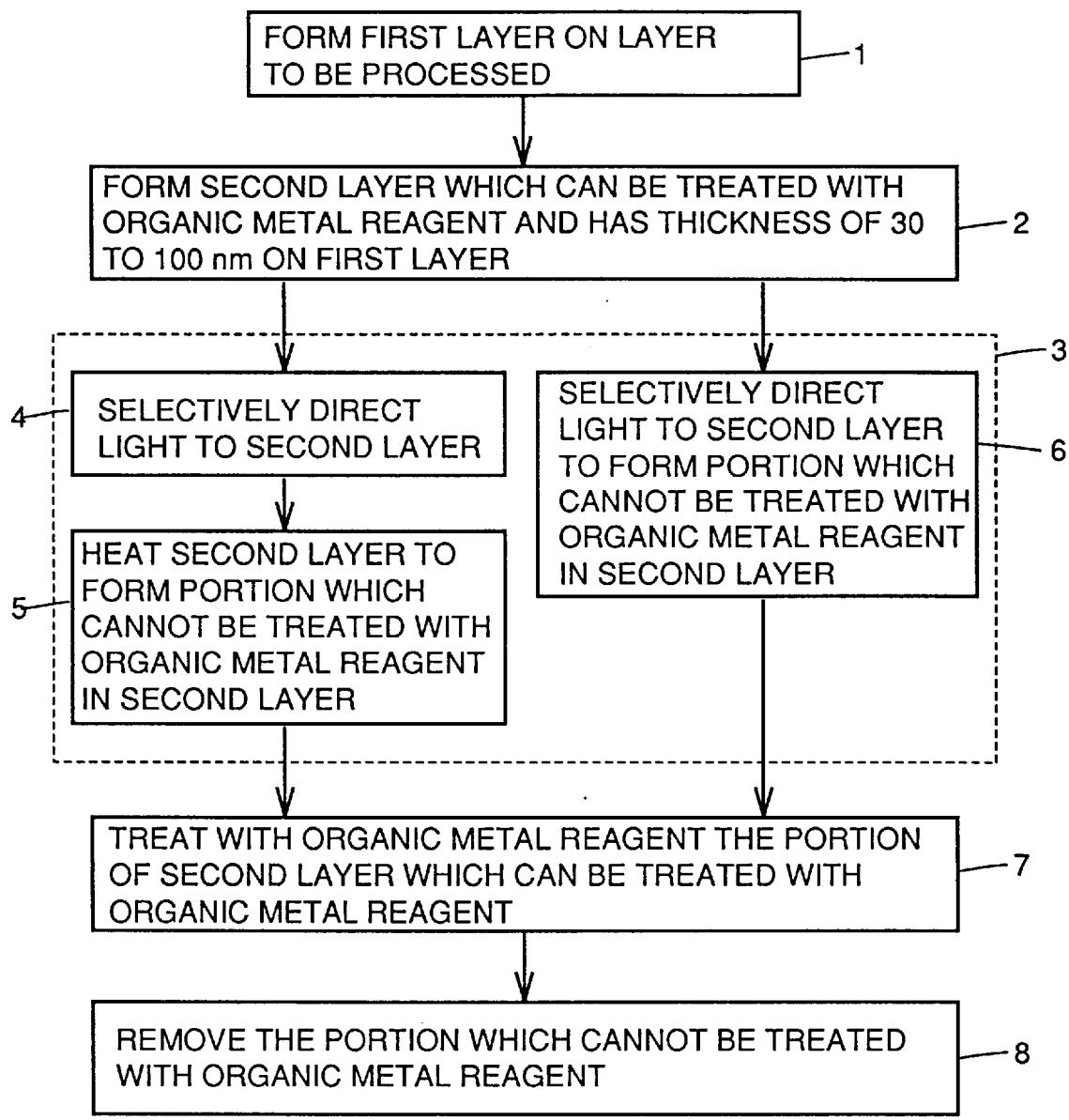
FIG. 1 is a diagram showing the steps of a method of forming a pattern according to first to third embodiments of the present invention.

Referring to FIG. 1, in a method of forming a pattern according to a first embodiment, a first layer is first formed by applying an organic material on a layer to be processed (step 1), wherein the layer to be processed includes a semiconductor substrate, a conductive layer or an insulating film.

Next, a second layer having a thickness in the range from 30 to 100 nm is formed by applying a material which can be treated with an organic metal reagent on the first layer formed in the step 1 (step 2), wherein organic metal is metal which has bonded to carbon, and the metal includes silicon. Furthermore, the material which can be treated with an organic metal reagent includes a material containing active hydrogen. A specific example of the material containing active hydrogen includes a material containing an OH group, a COOH group, an NH group or an SH group.

Then, a portion which cannot be treated with an organic metal reagent is selectively formed in the second layer formed in the step 2 (step 3).

After that, a portion of the second layer which can be treated with an organic metal reagent, that is, the second layer except the portion formed in the step 3 which cannot be treated with an organic metal reagent is treated with an organic metal reagent (step 7). A method of treating a portion of the second layer with an organic metal reagent includes a method of silylating the second layer by reacting the second layer with vapor containing silicon.

Finally, the portion which cannot be treated with an organic metal reagent and a portion of the first layer which is located thereunder are removed (step 8).

In the method of forming a pattern which includes such steps as described above, the second layer which can be treated with an organic metal reagent has a thickness in the range from 30 to 100 nm. Therefore, the volume of the portion which can be treated with an organic metal reagent is smaller as compared to a conventional method of forming a pattern in which a layer which can be treated with an organic metal reagent has a thickness of at least 200 nm. Accordingly, when the portion which can be treated with an organic metal reagent is treated with an organic metal reagent, swelling of the portion can be reduced as compared with the conventional example. As a result, even if the distance between portions which can be treated with an organic metal reagent is small, the portions which have been treated with an organic metal reagent will not come into contact with each other, so that fine pattern can be formed with high accuracy.

If the second layer has a thickness of more than 100 nm, a pattern having a width of at most 0.20 μm cannot be formed due to swelling of the portion which has been treated with an organic metal reagent. Furthermore, if the second layer has a thickness of less than 30 nm, the portion which has been treated with an organic metal reagent is also removed at the time of removing the portion which cannot be treated with an organic metal reagent, so that a pattern having a width of at most 0.20 μm cannot be formed. Consequently, the second layer must have a thickness in the range from 30 to 100 μm.

In addition, since swelling of the portion which has been treated with an organic metal reagent is small, the portion which has been treated with an organic reagent has approximately the same thickness both at the center and at the end thereof. Therefore, since the portion which has been treated with an organic metal reagent does not become thinner towards the end thereof, the end will not be removed. Therefore, a fine pattern can be formed with high accuracy.

(Second Embodiment)

Referring to FIG. 1, in a method of forming a pattern according to a second embodiment, a first layer is formed by applying an organic material on a layer to be processed (step 1), wherein the layer to be processed includes a semiconductor substrate, a conductive layer or an insulating film. Furthermore, the organic material used in the step 1 preferably has light reflectance of at most 5% for light used in a step 4 which will be described later.

Next, a second layer having a thickness in the range from 30 to 100 nm is formed by applying a material which can be treated with an organic metal reagent on the first layer formed in the step (step 2), wherein the material which can be treated with an organic metal reagent includes a material containing active hydrogen. A specific example of the material containing active hydrogen includes a material containing an OH group, a COOH group, an NH group or an SH group.

In addition, a protective film is preferably formed at a surface of the second layer when the second layer is formed.

Then, light is selectively directed to the second layer formed in the step 2 (step 4).

Light directed to the second layer includes light having a wavelength of at most 200 nm or KrF excimer laser beams. Electron beams or X rays rather than light may be directed to the second layer.

After that, the portion of the second layer to which light is directed in the step 4 is turned into a portion which cannot be treated with an organic metal reagent by heating the second layer (step 5).

Then, a portion of the second layer which can be treated with an organic metal reagent, that is, the second layer except the portion obtained by the step 5 which cannot be treated with an organic metal reagent is treated with an organic metal reagent (step 7). A method of treating the portion of the second layer with an organic metal reagent includes a method of selectively silylating the second layer by reacting the second layer with vapor containing silicon.

Finally, the portion which cannot be treated with an organic metal reagent and a portion of the first layer which is located thereunder are removed (step 8).

In the method of forming a pattern which includes such steps as described above, the second layer which can be treated with an organic metal reagent has a thickness in the range from 30 to 100 nm. Therefore, the volume of the portion which can be treated with an organic metal reagent is smaller as compared with a conventional method of forming a pattern in which a layer which can be treated with an organic metal reagent has a thickness of at least 200 nm. Accordingly, when the portion which can be treated with an organic metal reagent is treated with an organic metal reagent, swelling of the portion can be reduced as compared with the conventional example. As a result, even if the distance between the portions which can be treated with an organic metal reagent is small, the portions which have been treated with an organic metal reagent will not come into contact with each other, so that a fine pattern can be formed with high accuracy.

If the second layer has a thickness of more than 100 nm, a pattern having a width of at most 0.20 µm cannot be formed due to swelling of the portion which has been treated with an organic metal reagent. In addition, if the second layer has a thickness of less than 30 nm, the portion which has been treated with an organic metal reagent is also removed in removing the portion which cannot be treated with an organic metal reagent, so that a pattern having a width of at most 0.20 µm cannot be formed. Accordingly, the second layer must have a thickness in the range from 30 to 100 nm.

Furthermore, since swelling of the portion which has been treated with an organic metal reagent is small, the portion which has been treated with an organic metal reagent has approximately the same thickness both at the center and at the end thereof. Therefore, since the portion which has been treated with an organic metal reagent does not become thinner towards the end thereof, the end will not be removed. As a result, a fine pattern can be formed with high accuracy.

Furthermore, the organic material contained in the first layer has light reflectance of at most 5% for light used in the step 4. Therefore, since reflection of light from the first layer is small in the step 4, the second layer is hardly exposed to that reflected light. In addition, if a protective film has been formed on the second layer, the second layer will not be corroded by a basic material. Consequently, a desired pattern can be formed with high accuracy.

(Third embodiment)

Referring to FIG. 1, in a method of forming a pattern according to a third embodiment, a first layer is formed by applying an organic material on a (step 1 be processed (step 1), wherein the layer to be processed includes a semiconductor substrate, a conductive layer or an insulating film.

Next, a second layer having a thickness in the range from 30 to 100 nm is formed by applying a material which can be treated with an organic metal reagent on the first layer formed in the step 1 (step 2), wherein the material which can be treated with an organic metal reagent includes a material containing active hydrogen. A specific example of the material containing active hydrogen includes a material containing an OH group, a COOH group, an NH group or an SH group. Furthermore, the material which can be treated with an organic metal reagent preferably has light transmittance of at least 80% for light used in a step 6 which will be described later.

Then, light is selectively directed to the second layer formed in the step 2 to turn a portion of the second layer which has been exposed to the light into a portion which cannot be treated with an organic metal reagent (step 6), wherein light directed to the second layer includes light having a wavelength of at most 200 nm or KrF excimer laser beams. In addition, electron beams or X rays rather than light may be directed to the second layer.

Preferably, light is selectively directed to the second layer in inert gas. Furthermore, the intensity of light used in the step 6 is preferably at least 10 mJ/cm$^2$/pulse.

Then, a portion of the second layer which can be treated with an organic metal reagent, that is, the second layer except the portion obtained in the step 6 which cannot be treated with an organic metal reagent is treated with an organic metal reagent (step 7), wherein a method of treating the portion of the second layer with an organic metal reagent includes a method of selectively silylating the second layer by reacting the second layer with vapor containing silicon.

Finally, the portion which cannot be treated with an organic metal reagent and a portion of the first layer which is located thereunder are removed (step 8).

In a method of forming a pattern which includes such steps as described above, the second layer which can be treated with an organic metal reagent has a thickness in the range from 30 to 100 nm. Therefore, the volume of the portion which can be treated with an organic metal reagent is smaller as compared with a conventional method of forming a pattern in which a layer which can be treated with an organic metal reagent has a thickness of at least 200 nm. Accordingly, when the portion which can be treated with an organic metal reagent is treated with an organic metal reagent, swelling of the portion can be reduced as compared with the conventional example. As a result, even if the distance between the portions which can be treated with an organic metal reagent is small, the portions which have been treated with an organic metal reagent will not come into contact with each other, so that a fine pattern can be formed with high accuracy.

If the second layer has a thickness of more than 100 nm, a pattern having a width of at most 0.20 µm cannot be formed due to swelling of the portion which has been treated with an organic metal reagent. Furthermore, if the second layer has a thickness of less than 30 nm, the portion which has been treated with an organic metal reagent is also removed in removing the portion which cannot be treated with an organic metal reagent, so that a pattern having a width of at most 0.20 µm cannot be formed. Consequently, the second layer must have a thickness in the range from 30 to 100 nm.

Furthermore, since swelling of the portion which has been treated with an organic metal reagent is small, the portion which has been treated with an organic metal reagent has approximately the same thickness both at the center and at the end thereof. Therefore, since the portion which has been treated with an organic metal reagent does not become thinner towards the end thereof, the end will not be removed. As a result, a fine pattern can be formed with high accuracy.

If light is selectively directed to the second layer in inert gas in the step 6, the speed of a chemical reaction which occurs at the time when the portion of the second layer which has been exposed to the light is turned into a portion which cannot be treated with an organic metal reagent is increased. As a result, the portion which cannot be treated with an organic metal reagent can be formed efficiently.

If light used in the step 6 has an intensity of at least 10 mJ/cm$^2$/pulse, a large amount of light will be directed to the second layer. Therefore, the speed of the chemical reaction which occurs at the time when the portion of the second layer which has been exposed to the light is turned into a portion which cannot be treated with an organic metal reagent is increased. As a result, the portion which cannot be treated with an organic metal reagent can be formed efficiently.

In addition, if the material which can be treated with an organic metal reagent in the second layer has transmittance of at least 80% for light used in the step 6, light will reach the bottom of the second layer. Therefore, the speed at which the entire portion of the second layer which has been exposed to the light is uniformly turned into a portion which cannot be treated with an organic metal reagent is increased. As a result, the portion which cannot be treated with an organic metal reagent can be formed efficiently.

(Fourth Embodiment)

Figure 2:
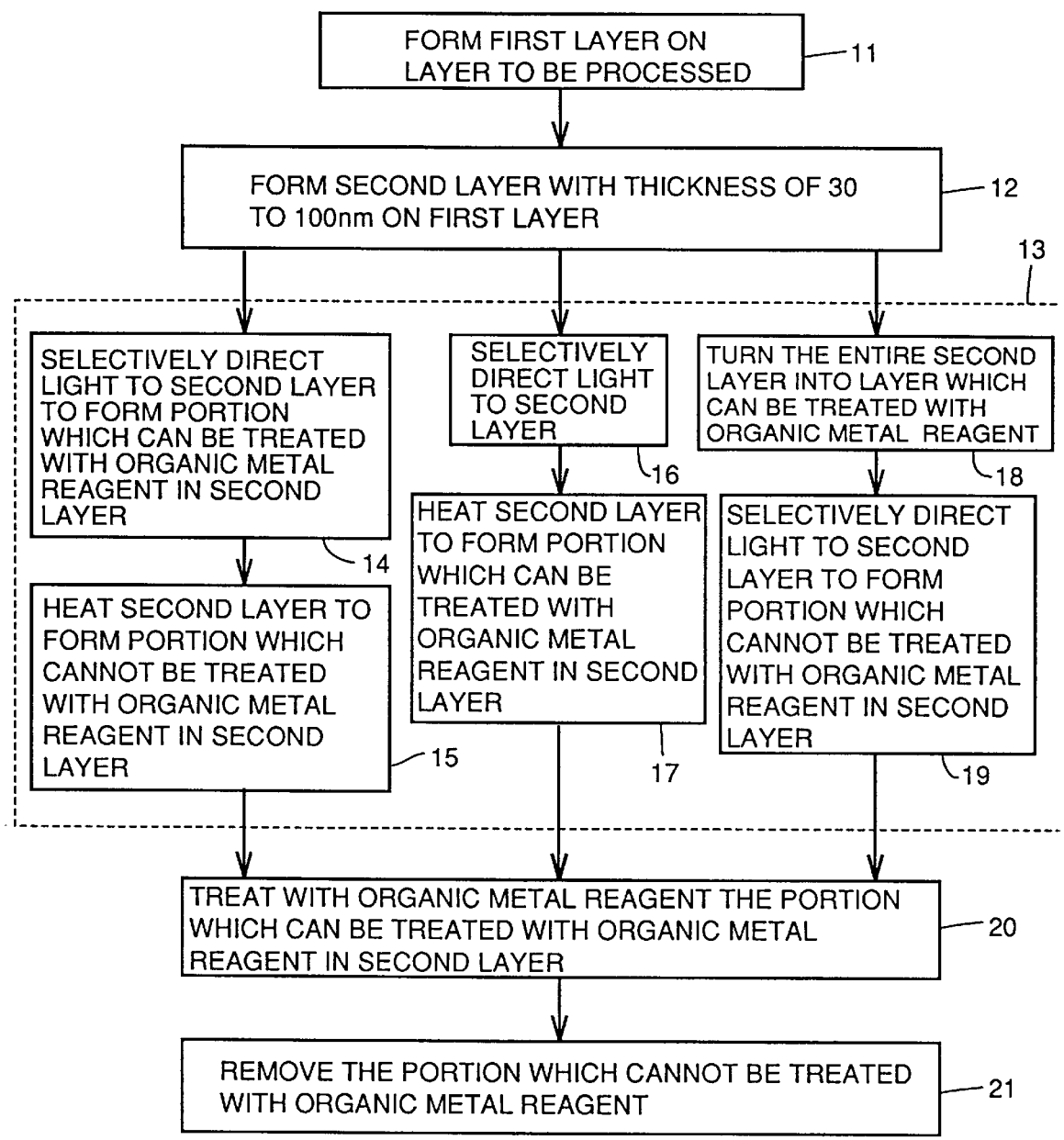
FIG. 2 is a diagram showing the steps of a method of forming a pattern according to fourth to seventh embodiments of the present invention.

Referring to FIG. 2, in a method of forming a pattern according to a fourth embodiment, a first layer is first formed by applying a first organic material on a layer to be processed (step 11), wherein the layer to be processed includes a semiconductor substrate, a conductive layer or an insulating film.

Then, a second layer having a thickness in the range from 30 to 100 nm is formed by applying a second organic material on the first layer formed in the step 11 (step 12).

Next, a portion which can be treated with an organic metal reagent is selectively formed in the second layer formed in the step 12 (step 13).

After that, the portion which can be treated with an organic metal reagent is treated with an organic metal reagent (step 20), wherein a method of treating the portion of the second layer with an organic metal reagent includes a method of selectively silylating the second layer by reacting the second layer with vapor containing silicon.

Finally, the second layer except the portion which can be treated with an organic metal reagent, that is, a portion which cannot be treated with an organic metal reagent and a portion of the first layer which is located under the portion which cannot be treated with an organic metal reagent are removed (step 21).

In the method of forming a pattern which includes such steps as described above, the portion formed in the step 13 which can be treated with an organic metal reagent has a thickness in the range from 30 to 100 nm. Therefore, the volume of the portion which can be treated with an organic metal reagent is smaller as compared with a conventional method of forming a pattern in which a layer which can be treated with an organic metal reagent has a thickness of at least 200 nm. Accordingly, when the portion which can be treated with an organic metal reagent is treated with an organic metal reagent, swelling of the portion can be reduced as compared with the conventional example. As a result, even if the distance between the portions which can be treated with an organic metal reagent is small, the portions which have been treated with an organic metal reagent will not come into contact with each other, so that a fine pattern can be formed with high accuracy.

If the second layer has a thickness of more than 100 nm, a pattern having a width of at most 0.20 µm cannot be formed due to swelling of the portion which has been treated with an organic metal reagent. In addition, if the second layer has a thickness of less than 30 nm, the portion which has been treated with an organic metal reagent is also removed in removing the portion which cannot be treated with an organic metal reagent, so that a pattern having a width of at most 0.20 µm cannot be formed. Therefore, the second layer must have a thickness in the range from 30 to 100 nm.

Furthermore, since swelling of the portion which has been treated with an organic metal reagent is small, the portion which has been treated with an organic metal reagent has approximately the same thickness both at the center and at the end thereof. Therefore, since the portion which has been treated with an organic metal reagent does not become thinner towards the end thereof, the end will not be removed. As a result, a fine pattern can be formed with high accuracy.

(Fifth Embodiment)

Referring to FIG. 2, in a method of forming a pattern according to a fifth embodiment, a first layer is first formed by applying a first organic material on a layer to be processed (step 11), wherein the layer to be processed includes a semiconductor substrate, a conductive layer or an insulating film.

Next, a second layer having a thickness in the range from 30 to 100 nm is formed by applying a second organic material on the first layer formed in the step 11 (step 12).

Then, light is selectively directed to the second layer formed in the step 12 to turn a portion of the second layer which has been exposed to the light into a portion which can be treated with an organic metal reagent (step 14), wherein light directed to the second layer includes light having a wavelength of at most 200 nm or KrF excimer laser beams. Furthermore, electron beams or X rays rather than light may be directed to the second layer.

Then, the second layer except the portion formed in the step 14 which can be treated with an organic metal reagent is turned into a portion which cannot be treated with an organic metal reagent by heating the second layer (step 15).

After that, the portion formed in the step 14 which can be treated with an organic metal reagent is treated with an organic metal reagent (step 20), and a method of which includes a method of selectively silylating the second layer by reacting the second layer with vapor containing silicon.

Finally, the portion formed in the step 15 which cannot be treated with an organic metal reagent and a portion of the first layer which is located thereunder are removed (step 21).

In a method of forming a pattern which includes such steps as described above, the portion formed in the step 14 which can be treated with an organic metal reagent has a thickness in the range from 30 to 100 nm. Therefore, the volume of the portion which can be treated with an organic metal reagent is smaller as compared with a conventional method of forming a pattern in which a layer which can be treated with an organic metal reagent has a thickness of at least 200 nm. Accordingly, when the portion which can be treated with an organic metal reagent is treated with an organic metal reagent, swelling of the portion can be reduced as compared with the conventional example. As a result, even if the distance between the portions which can be treated with an organic metal reagent is small, the portions which have been treated with an organic metal reagent will not come into contact with each other, so that a fine pattern can be formed with high accuracy.

If the second layer has a thickness of more than 100 nm, a pattern having a width of at most 0.20 $\mu$m cannot be formed due to swelling of the portion which has been treated with an organic metal reagent. In addition, if the second layer has a thickness of less than 30 nm, the portion which has been treated with an organic meal reagent is also removed in removing the portion which cannot be treated with an organic metal reagent, so that a pattern having a width of at most 0.20 $\mu$m cannot be formed. Accordingly, the second layer must have a thickness in the range from 30 to 100 nm.

In addition, since swelling of the portion which has been treated with an organic metal reagent is small, the portion which has been treated with an organic metal has approximately the same thickness both at the center and at the end thereof. Therefore, since the portion which has been treated with an organic metal reagent does not become thinner towards the end thereof, the end will not be removed. As a result, a fine pattern can be formed with high accuracy.

(Sixth Embodiment)

Referring to FIG. 2, in a method of forming a pattern according to a sixth embodiment, a first layer is first formed by applying a first organic material on a layer to be processed (step 11), wherein the layer to be processed includes a semiconductor substrate, a conductive layer or an insulating film.

Next, a second layer having a thickness in the range from 30 to 100 nm is formed by applying a second organic material on the first layer formed in the step 11 (step 12).

Then, light is selectively directed to the second layer formed in the step 12 (step 16), wherein light directed to the second layer includes light having a wavelength of at most 200 nm or KrF excimer laser beams. In addition, electron beams or X rays rather than light may be directed to the second layer.

Then, the portion of the second layer which has been exposed to the light in the step 16 is turned into a portion which can be treated with an organic metal reagent by heating the second layer (step 17).

After that, the portion formed in the step 17 which can be treated with an organic metal reagent is treated with an organic metal reagent (step 20), and a method of which includes a method of selectively silylating the second layer by reacting the second layer with vapor containing silicon.

Finally, the second layer except the portion formed in the step 17 which can be treated with an organic metal reagent, that is, a portion which cannot be treated with an organic metal reagent, and a portion of the first layer which is located under the portion which cannot be treated with an organic metal reagent are removed (step 21).

In a method of forming a pattern which includes such steps as described above, the portion formed in the step 17 which can be treated with an organic metal reagent has a thickness in the range from 30 to 100 nm. The volume of the portion which can be treated with an organic metal reagent is smaller as compared with a conventional method of forming a pattern in which a layer which can be treated with an organic metal reagent has a thickness of at least 200 nm. Therefore, when if the portion which can be treated with an organic metal reagent is treated with an organic metal reagent, swelling of the portion can be reduced as compared with the conventional example. As a result, if the distance between the portions which can be treated with an organic metal reagent is small, the portions which have been treated with an organic metal reagent will not come into contact with each other, so that a fine pattern can be formed with high accuracy.

If the second layer has a thickness of more than 100 nm, a pattern having a width of at most 0.20 $\mu$m cannot be formed due to swelling of the portion which has been treated with an organic metal reagent. Furthermore, if the second layer has a thickness of less than 30 nm, the portion which has been treated with an organic metal reagent is also removed in removing the portion which cannot be treated with an organic metal reagent, so that a pattern having a width of at most 0.20 $\mu$m cannot be formed. Therefore, the second layer must have a thickness in the range from 30 to 100 nm.

In addition, since swelling of the portion which has been treated with an organic metal reagent is small, the portion which has been treated with an organic metal reagent has approximately the same thickness both at the center and at the end thereof. Therefore, since the portion which has been treated with an organic metal reagent does not become thinner towards the end thereof, the end will not be removed. As a result, a fine pattern can be formed with high accuracy.

(Seventh Embodiment)

Referring to FIG. 2, in a method of forming a pattern according to a seventh embodiment, a first layer is first formed by applying a first organic material on a layer to be processed (step 11), wherein the layer to be processed includes a semiconductor substrate, a conductive layer or an insulating film.

Next, a second layer having a thickness in the range from 30 to 100 nm is formed by applying a second organic material on the first layer formed in the step 11 (step 12).

Then, the entire second layer formed in the step 12 is turned into a layer which can be treated with an organic metal reagent (step 18), and a method of which includes a method of directing ultraviolet rays to the entire second layer.

After that, light is selectively directed to the second layer obtained by the step 18 which can be treated with an organic metal reagent to turn a portion of the second layer which has been exposed to the light into a portion which cannot be treated with an organic metal reagent (step 19). Light directed to the second layer includes light having a wavelength of at most 200 nm or KrF excimer laser beams. Furthermore, electron beams or X rays rather than light may be directed to the second layer.

Preferably, light is selectively directed to the second layer in inert gas.

Next, the second layer except the portion formed in the step 19 which cannot be treated with an organic metal reagent, that is, a portion which can be treated with an organic metal reagent is treated with an organic metal reagent (step 20), and a method of which includes a method of selectively silylating the second layer by reacting the second layer with vapor containing silicon.

Finally, the portion formed in the step 19 which cannot be treated with an organic metal reagent and a portion of the first layer which is located thereunder are removed (step 21).

In a method of forming a pattern which includes such steps as described above, the portion formed in the step 18 which can be treated with an organic metal reagent has a thickness in the range from 30 to 100 nm. Therefore, the volume of the portion which can be treated with an organic metal reagent is smaller as compared with a conventional method of forming a pattern in which a layer which can be treated with an organic metal reagent has a thickness of at least 200 nm. Accordingly, when the portion which can be treated with an organic metal reagent is treated with an organic metal reagent, swelling of the portion can be reduced as compared with the conventional example. As a result, even if the distance between the portions which can be treated with an organic metal reagent is small, the portions which have been treated with an organic metal reagent will not come into contact with each other, so that a fine pattern can be formed with high accuracy.

If the second layer has a thickness of more than 100 nm, a pattern having a width of at most 0.20 $\mu$m cannot be formed due to swelling of the portion which has been treated with an organic metal reagent. Furthermore, if the second layer has a thickness of less than 30 nm, the portion which has been treated with an organic metal reagent is also removed in removing the portion which cannot be treated with an organic metal reagent, so that a pattern having a width of at most 0.20 $\mu$m cannot be formed. Accordingly, the second layer must have a thickness in the range from 30 to 100 nm.

In addition, since swelling of the portion which has been treated with an organic metal reagent is small, the portion has approximately the same thickness both at the center and at the end thereof. Therefore, the thickness of the portion does not become thinner towards the end thereof, and the end will not be removed. As a result, a fine pattern can be formed with high accuracy.

Furthermore, if ultraviolet rays are directed to the entire second layer in the step 18 to make the entire second layer capable of being treated with an organic metal reagent, the entire second layer can be treated with an organic metal reagent efficiently.

Furthermore, if light is selectively directed to the second layer in inert gas in the step 19, the speed of a chemical reaction which occurs when the portion exposed to the light is turned into a portion which cannot be treated with an organic metal reagent is increased. As a result, the portion which cannot be treated with an organic metal reagent can be formed efficiently.

[EXAMPLES]

Examples of the present invention will now be described in conjunction with the accompanying drawings

[Example 1]

An example 1 corresponds to the first and second embodiments.

Figure 3:
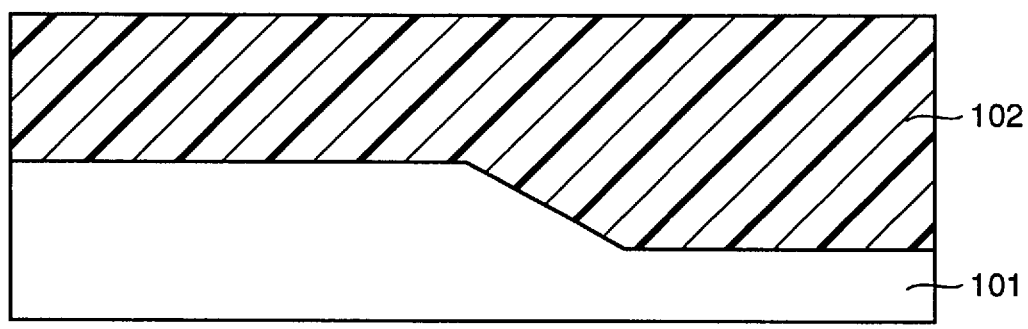
FIGS. 3 to 6, 8 and 9 are cross sectional views respectively showing first to sixth steps of a method of forming a pattern according to examples 1 to 4 and 12 of the present invention.

Referring to FIG. 3, OFPR 800 (product name) made by Tokyo Ohka Kogyo Co., Ltd. was applied by spin coating on a layer 101 to be processed. OFPR 800 and layer 101 were heated on a hot plate for 120 seconds at a temperature of 200° C. to form a lower resist layer 102 having a thickness of 1 $\mu$m.

Figure 4:
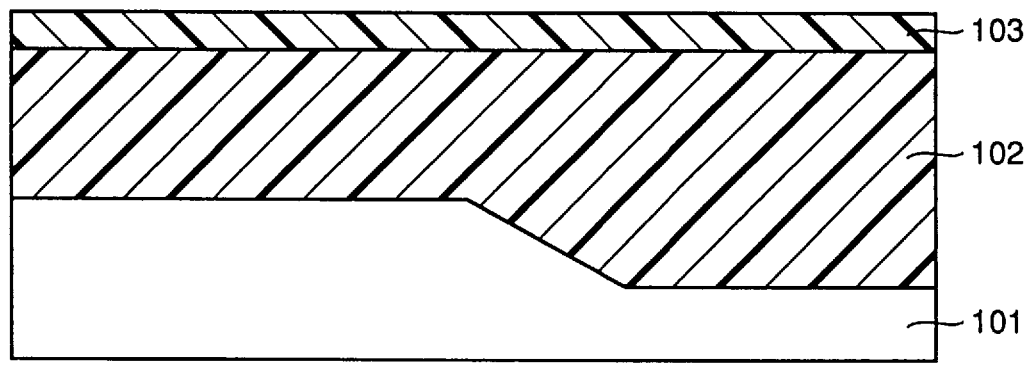

Referring to FIG. 4, SNR 200 (product name) made by Shipley Co. which contains resin having OH groups, an acid generating agent and a crosslinking agent reacting with acid was applied on lower resist layer 102 by spin coating. Layer 101, lower resist layer 102 and SNR 200 were heated on a hot plate for 90 seconds at 100° C. to form an upper resist layer 103 having a thickness of 50 nm.

Figure 5:
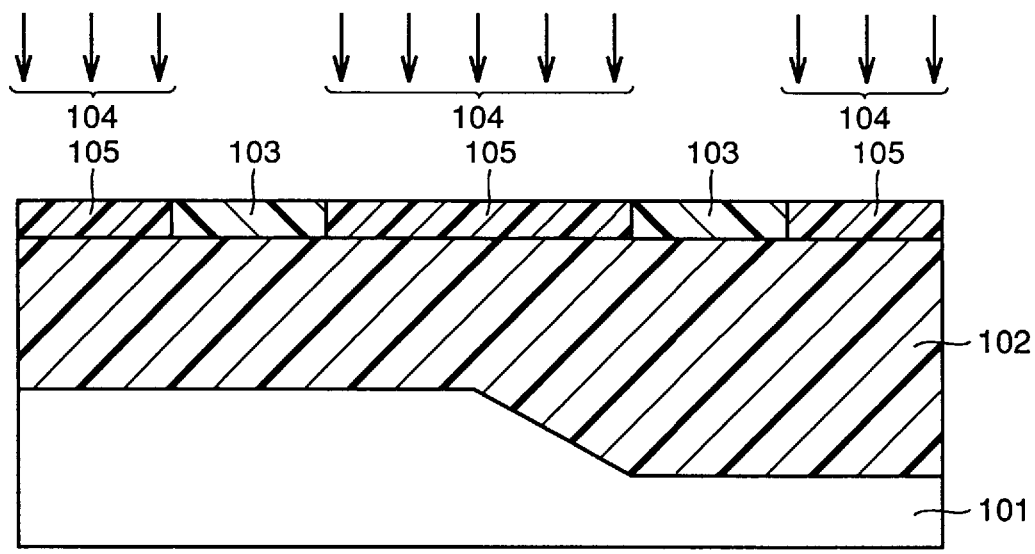

Referring to FIG. 5, KrF excimer laser beams (wavelength of 248 nm) shown by arrows 104 in the figure were selectively directed through a mask to upper resist layer 103 using a KrF excimer stepper (the numerical aperture NA of a lens=0.50, $\sigma$=0.5). Thus, an exposed region 105 was formed. Acid was generated in exposed region 105 by reaction of the acid generating agent and the KrF excimer laser beams.

Figure 6:
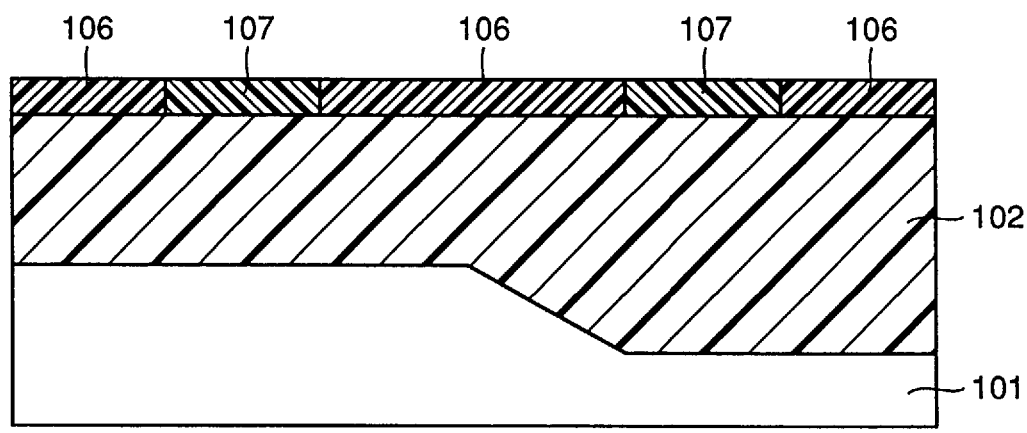

Referring to FIG. 6, heat treatment (post-exposure baking) was carried out using the hot plate for 120 seconds at 105° C. to form an un-silylatable layer 106 and a silylatable layer 107. Both un-silylatable layer 106 and silylatable layer 107 had a thickness of 50 nm.

Figure 7:
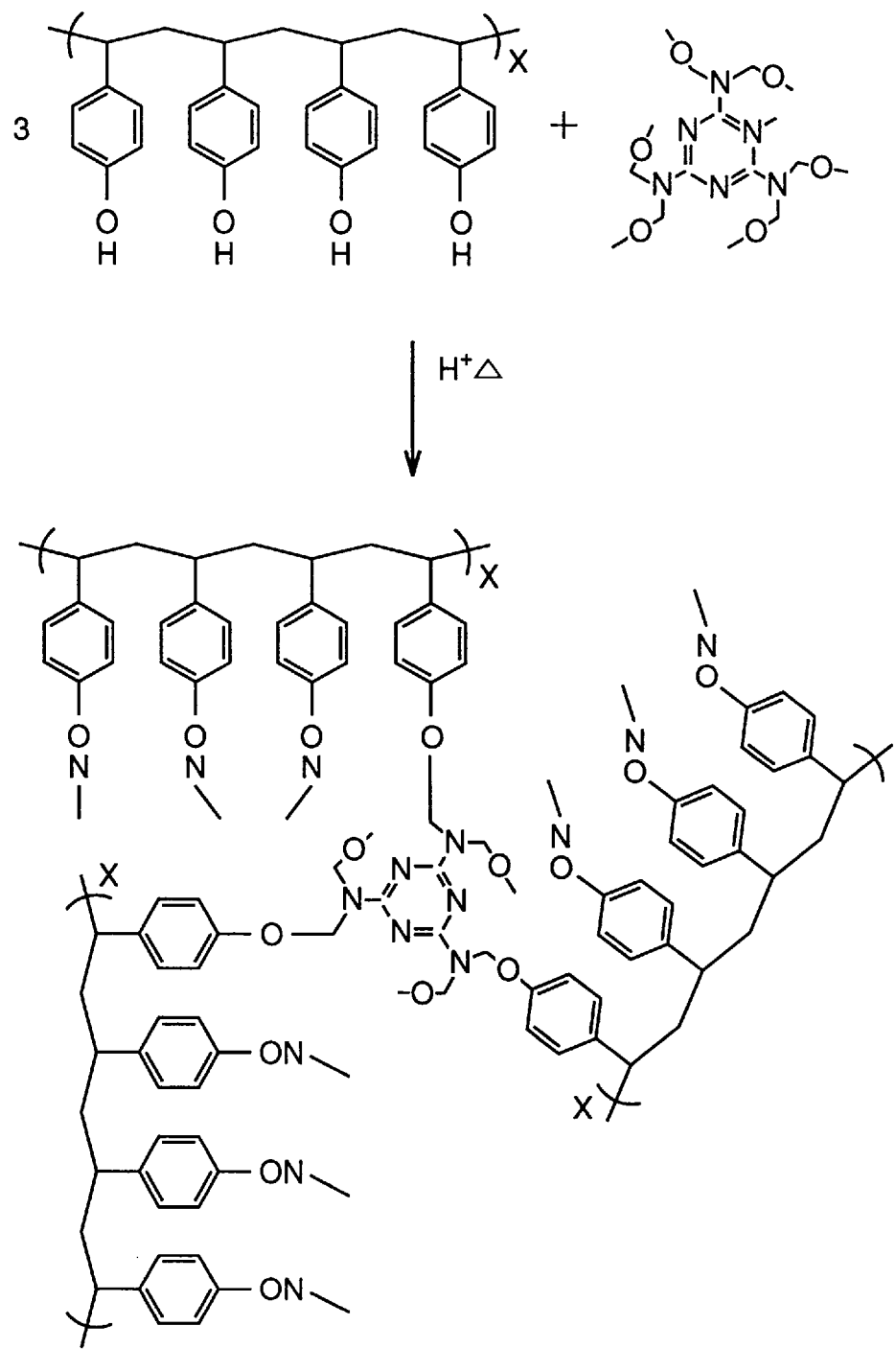
FIG. 7 is a diagram showing a chemical reaction which occurs in an un-silylatable layer 106 in FIG. 6.

Referring to FIG. 7, the resin containing OH groups and the crosslinking agent combined with each other with a catalyst of acid ($H^+$ in the figure) by heat treatment ($\Delta$ in the figure).

Figure 8:
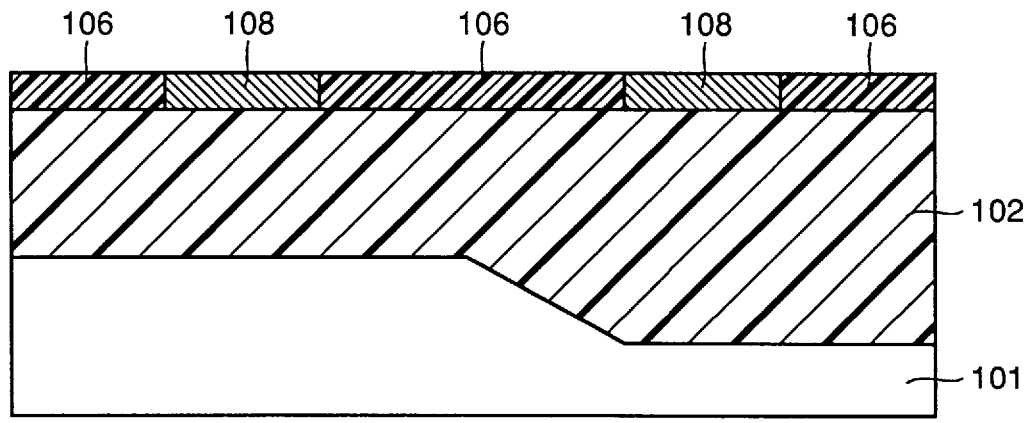

Referring to FIG. 8, silylation was carried out by making un-silylatable layer 106 and silylatable layer 107 (FIG. 6) in contact with dimethylsilyldiethylamine vapor as an organic metal reagent for 60 seconds in an atmosphere with a pressure of 40 Torr and at a temperature of 70° C., whereby a silylated layer 108 was formed.

Figure 9:
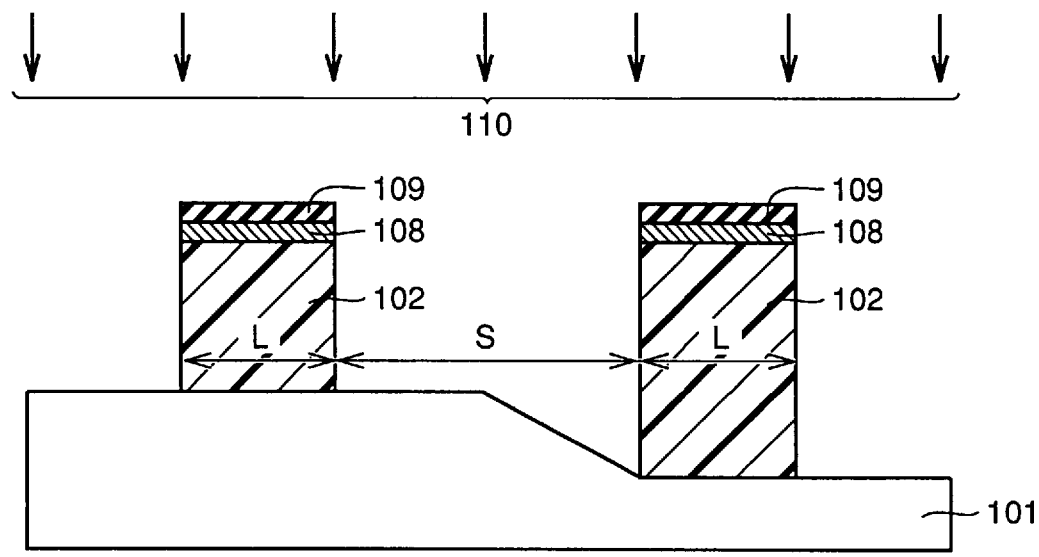

Referring to FIG. 9, dry etching was performed with oxygen plasma shown by arrows 110. At this time, a surface of silylated layer 108 reacted with oxygen plasma to form an oxide film 109. Therefore, since oxide film 109 provides a shield against oxygen plasma, silylated layer 108 was not etched. As a result, a positive pattern with a resolution of 0.18 $\mu$mL/S was obtained, where 0.18 $\mu$mL/S indicates L (FIG. 9)=0.18 $\mu$m and S (FIG. 9)=0.18 $\mu$m. In addition, this pattern had no scum (resist left unetched more than necessary), and had a rectangular cross section. Furthermore, there was no halation caused by light reflection from a stepped portion of layer 101.

According to the present example, as shown in FIG. 6, silylatable layer 107 has a thickness of 50 nm which is smaller than a thickness (200 to 220 nm) of a layer to be silylated in the conventional example, and therefore, the volume of a portion to be silylated is also small. Accordingly, when silylatable layer 107 is silylated, silylated layer 108 (FIG. 8) will not swell so much as the conventional example. As a result, a fine pattern can be formed with high accuracy.

In addition, since swelling of silylated layer 108 can be prevented, silylated layer 108 has approximately the same thickness both at the center and at the end thereof. Therefore, the end of silylated layer 108 will not be etched, so that a fine pattern can be formed with high accuracy.

Furthermore, since the volume of the portion to be silylated is small, the amount of a reagent used for silylation can be reduced.

Since upper resist layer 103 is thinner than the conventional example, KrF excimer laser beams shown by arrows 104 reach the bottom of exposed region 105 in the step shown in FIG. 5, so that acid is generated in the entire exposed region 105. Therefore, when exposed region 105 is heated, it is ensured that reaction shown in FIG. 7 occurs in the entire exposed region 105, so that a density of un-silylatable layer 106 is improved and OH groups disappear from un-silylatable layer 106. Since dimethylsilyldiethylamine vapor does not diffuse into such high density un-silylatable layer 106, un-silylatable layer 106 will not be silylated. Furthermore, even if dimethylsilyldiethylamine vapor diffuses therein, un-silylatable layer 106 has few OH groups, so that un-silylatable layer 106 will not be silylated. As a result, un-silylatable layer 106 does not form an oxide film which provides a shield against oxygen plasma in the step shown in FIG. 9. Therefore, un-silylatable layer 106 and lower resist layer 102 located thereunder are removed completely, and generation of scum can be prevented.

In addition, in the case of reduction-type projection printing, since an optical reaction is carried out in an extremely thin layer, improvement in resolution and in depth of focus can be achieved.

[Example 2]

An example 2 corresponds to the first and second embodiments.

Figure 10:
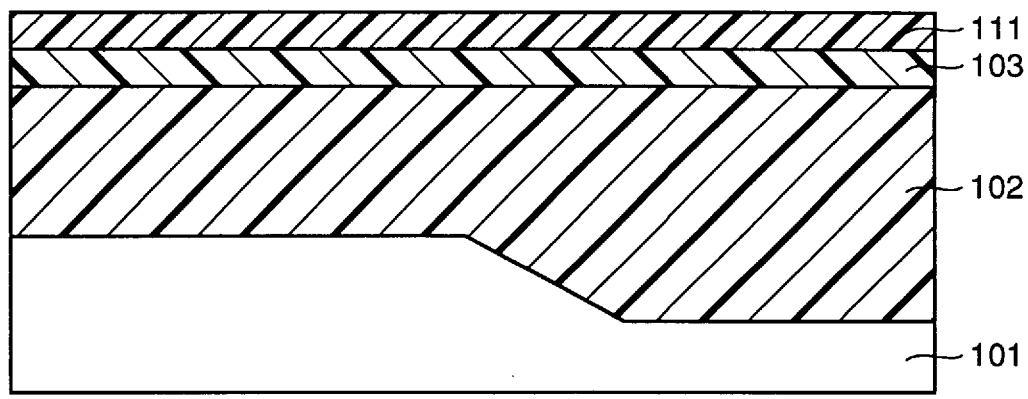
FIG. 10 is a cross sectional view showing one step of a method of forming a pattern according to the example 2 of the present invention.

In the Example 2, a pattern was formed as shown in FIGS. 3 to 9 in a manner similar to that of the Example 1. The Examples 1 and 2 are different from each other only in that, in the Example 2, a protective film 111 made of polyacrylic acid was formed on an upper resist layer 103 as shown in FIG. 10 in the step shown in FIG. 4 of the Example 1. This protective film 111 was washed with water after formation of un-silylatable layer 106 and silylatable layer 107 shown in FIG. 6 of the Example 1. As a result, a positive pattern with a resolution of 0.18 μmL/S was obtained as in the case of the Example 1. In addition, this pattern has no scum, and has a rectangular cross section.

Thus, formation of the protective film on upper resist layer 103 prevents a basic material from being introduced into upper resist layer 103. Consequently, acid generated in exposed region 105 shown in FIG. 5 is not neutralized, so that the chemical reaction shown in FIG. 7 is facilitated.

[Example 3]

An example 3 corresponds to the first and second embodiments.

Referring to FIG. 3, resin made of polyamide carboxylic acid was applied by spin coating on a layer 101 to be processed. Resin of polyamido carboxylic acid and layer 101 were heated on a hot plate for 90 seconds at a temperature of 150° C. and further heated for 90 seconds at 200° C. to form a polyimido lower resist layer 102. This lower resist layer 102 contains neither OH group nor COOH group, and does not produce an OH group, a COOH group or the like which may bond to an organic metal reagent even if KrF excimer laser beams are directed thereto.

Referring to FIG. 4, SNR200 (product name) containing resin having OH groups, an acid generating agent and a crosslinking agent which reacts with acid was applied on lower resist layer 102 by spin coating. Layer 101, lower resist layer 102 and SNR200 were heated on a hot plate for 90 seconds at 100° C. to form an upper resist layer 103 having a thickness of 30 nm.

Referring to FIG. 5, KrF excimer laser beams (wavelength of 248 nm) shown by arrows 104 were selectively directed through a mask to upper resist layer 103 using a KrF excimer stepper (numerical aperture NA of a lens= 0.50, σ=0.5). Thus, an exposed region 105 was formed. Acid was generated in exposed region 105 by reaction of the acid generating agent and the KrF excimer laser beams.

Referring to FIG. 6, heat treatment post (post-exposure baking) was performed for 120 seconds at 105° C. using a hot plate to form an un-silylatable layer 106 and a silylatable layer 107. Both un-silylatable layer 106 and silylatable layer 107 had a thickness of 30 nm.

Referring to FIG. 7, in un-silylatable layer 106, the resin containing OH groups and the crosslinking agent combined with each other by heating (Δ in the figure) with acid ($H^+$ in the figure) serving as a catalyst.

Referring to FIG. 8, silylation was carried out by making un-silylatable layer 106 and silylatable layer 107 (FIG. 6) in contact with dimethylsilyldiethylamine vapor used as an organic metal reagent for 60 seconds in an atmosphere with a pressure of 40 Torr and at a temperature of 70° C. Thus, a silylated layer 108 was formed.

Referring to FIG. 9, dry etching was performed with oxygen plasma shown by arrows 110. A surface of silylated layer 108 reacted with oxygen plasma to form an oxide film 109. Since oxide film 109 provides a shield against oxygen plasma, silylated layer 108 was not etched. As a result, a positive pattern with a resolution of 0.18 μmL/S was obtained. In addition, there was neither scum nor halation caused by light reflection from a stepped portion in layer 101 in this pattern. Furthermore, this pattern had a rectangular cross section.

According to the present example, as shown in FIG. 6, since silylatable layer 107 has a thickness of 30 nm which is smaller than a thickness (200 to 220 nm) of a layer to be silylated in the conventional example, the volume of a portion to be silylated is small. Therefore, when silylatable layer 107 is silylated, silylated layer 108 (FIG. 8) will not swell so much the conventional example. As a result, a fine pattern can be formed with high accuracy.

Furthermore, since swelling of silylated layer 108 can be prevented, silylated layer 108 has approximately the same thickness both at the center and at the end thereof. Accordingly, the end of silylated layer 108 will not be etched, so that a fine pattern can be formed with high accuracy.

In addition, since silylatable layer 107 is thinner than the conventional example, the volume of the portion to be silylated is small. Therefore, the amount of a reagent used for silylation can be reduced.

Furthermore, since upper resist layer 103 is thinner than the conventional example, KrF excimer laser beams shown by arrows 104 reach the bottom of exposed region 105 in the step shown in FIG. 5, and acid is generated in the entire exposed region 105. Therefore, when exposed region 105 is heated, occurrence of the reaction shown in FIG. 7 is ensured in the entire exposed region 105, so that a density of un-silylatable layer 106 is improved and OH groups disappear from un-silylatable layer 106. Since dimethylsilyldiethylamine vapor does not diffuse into such high density un-silylatable layer 106, un-silylatable layer 106 will not be silylated. In addition, even if dimethylsilyldiethylamine vapor diffuses into un-silylatable layer 106, un-silylatable layer 106 has few OH groups and therefore will not be silylated. Consequently, un-silylatable layer 106 will not form an oxide film which provides a shield against oxygen plasma in the step shown in FIG. 9. Accordingly, un-silylatable layer 106 and lower resist layer 102 located thereunder are surely etched, and generation of scum can be prevented.

In the case of reduction-type projection printing, since an optical reaction is carried out in an extremely thin layer, improvement in resolution and in depth of focus can be achieved.

[Example 4]

An Example 4 corresponds to the first and second embodiments.

Referring to FIG. 3, an anti-reflection film ARC-CD11 (product name) made by Brewer Science Co. was applied by spin coating on a layer 101 to be processed. ARC-CD11 and layer 101 were heated on a hot plate for 60 seconds at a temperature of 100° C., and further heated for 60 seconds at 225° C. to form a lower resist layer 102. This lower resist layer 102 has reflectance of at most 5% for KrF excimer laser beams (wavelength of 248 nm).

Referring to FIG. 4, SNR200 (product name) containing resin having OH groups, an acid generating agent and a crosslinking agent which reacts with acid were applied on lower resist layer 102 by spin coating. Layer 101, lower resist layer 102 and SNR200 were heated on a hot plate for 90 seconds at 100° C. to form an upper resist layer 103 having a thickness of 100 nm.

Referring to FIG. 5, KrF excimer laser beams (wavelengths of 248 nm) shown by arrows 104 were selectively directed through a mask to upper resist layer 103 using a KrF excimer stepper (numerical aperture NA of a lens= 0.50, σ=0.5). Thus, an exposed region 105 was formed. Acid is generated in exposed region 105 by reaction of the acid generating agent and the KrF excimer laser beams.

Referring to FIG. 6, heat treatment (post-exposure baking) was carried out using a hot plate for 120 seconds at 105° C. to form an un-silylatable layer 106 and a silylatable layer 107. Un-silylatable layer 106 and silylatable layer 107 had a thickness of 100 nm.

Referring to FIG. 7, in un-silylatable layer 106, the resin containing OH groups and the crosslinking agent combined with each other by heating (Δ in the figure) with acid (H⁺ in the figure) serving as a catalyst.

Referring to FIG. 8, silylation was carried out by making un-silylatable layer 106 and silylatable layer 107 (FIG. 6) in contact with dimethylsilyldiethylamine vapor used as an organic metal reagent for 60 seconds in an atmosphere with a pressure of 40 Torr and at a temperature of 70° C. Thus, a silylated layer 108 was formed.

Referring to FIG. 9, dry etching was performed with oxygen plasma shown by arrows 110. A surface of silylated layer 108 reacted with oxygen plasma to form an oxide film 109. Since oxide film 109 provides a shield against oxygen plasma, silylated layer 108 was not etched. As a result, a positive pattern with a resolution of 0.18 $\mu$mL/S was obtained. In addition, this pattern had no scum and had a rectangular cross section. Furthermore, there was no halation caused by light reflection from a stepped portion of layer 101.

According to the present example, as shown in FIG. 6, since silylatable layer 107 has a thickness of 100 nm which is smaller than a thickness (200 to 220 nm) of a layer to be silylated in the conventional example, the volume of a portion to be silylated is small. Therefore, when if silylatable layer 107 is silylated, silylated layer 108 (FIG. 8) will not swell so much as the conventional example. As a result, a fine pattern can be formed with high accuracy.

Since swelling of silylated layer 108 can be prevented, silylated later 108 has approximately the same thickness both at the center and at the end thereof. Therefore, the end of silylated layer 108 will not be etched, and a fine pattern can be formed with high accuracy.

Furthermore, since silylatable layer 107 is thinner than the conventional example, the volume of the portion to be silylated is small. Therefore, the amount of an organic metal reagent used for silylation can be reduced.

In addition, since upper resist layer 103 is thinner than the conventional example, KrF excimer laser beams shown by arrows 104 reach the bottom of exposed region 105 in the step shown in FIG. 5, so that acid is generated in the entire exposed region 105. Therefore, if exposed region 105 is heated, occurrence of reaction shown in FIG. 7 is ensured in the entire exposed region 105, so that a density of un-silylatable layer 106 is improved and OH groups disappear from un-silylatable layer 106. Since dimethylsilyldiethylamine vapor does not diffuse into such high density un-silylatable layer 106, un-silylatable layer 106 will not be silylated. Furthermore, even if dimethylsilyldiethylamine vapor diffuses therein, un-silylatable silylatable layer 106 has few OH groups and therefore will not be silylated. As a result, un-silylatable layer 106 will not form an oxide film which provides a shield against oxygen plasma in the step shown in FIG. 9. Therefore, un-silylatable layer 106 and lower resist layer 102 located thereunder are surely etched, so that generation of scum can be prevented.

In addition, in the case of reduction-type projection printing, since an optical reaction is carried out in an extremely thin layer, improvement in resolution and in depth of focus can be achieved.

Furthermore, since the anti-reflection film having reflectance of at most 5% for KrF excimer laser beams is used as lower resist layer 102, light passing through exposed region 105 is almost absorbed by lower resist layer 102 in the step shown in FIG. 5 and will not enter upper resist layer 103. Therefore, light is directed only to exposed region 105, so that halation can be prevented.

[Example 5]

An Example 5 corresponds to the first and third embodiments.

Figure 11:
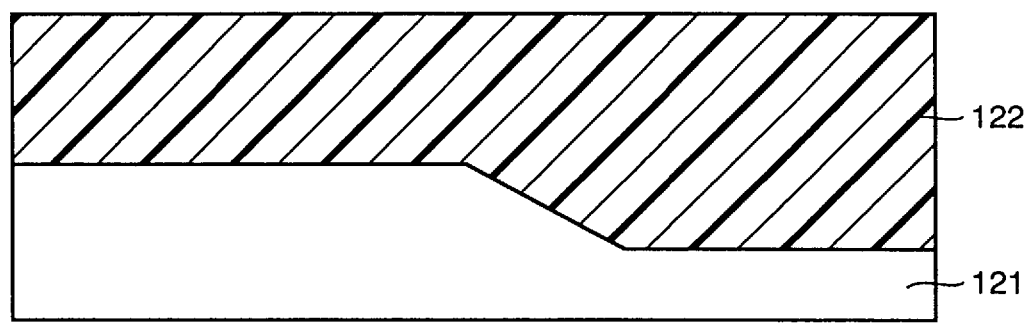
FIGS. 11, 12, 15 and 16 are cross sectional views respectively showing first, second, fourth and fifth steps of a method of forming a pattern according to examples 5 and 6 of the present invention.

Referring to FIG. 11, OFPR 800 (product name) was applied by spin coating on a layer 121 to be processed. OFPR 800 and layer 121 were heated on a hot plate for 120 seconds at 200° C. to form a lower resist layer 122 having a thickness of 1 $\mu$m.

Figure 12:
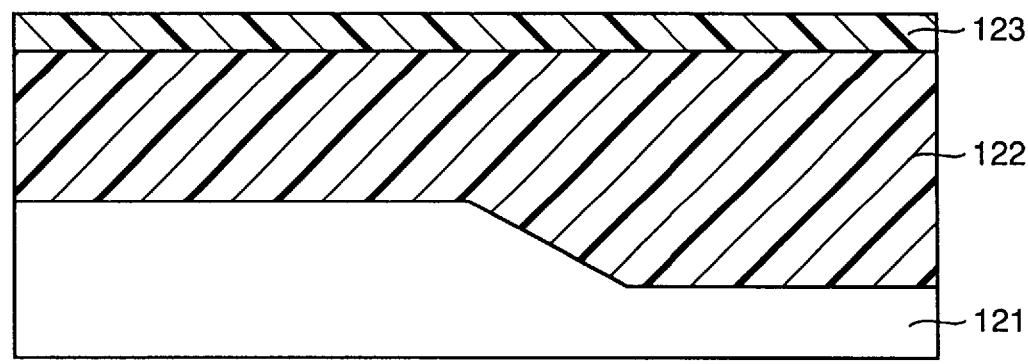

Referring to FIG. 12, polyhydroxystyrene which is general-purpose resin having OH groups was applied on lower resist layer 122 by spin coating. Layer 121, lower resist layer 122 and polyhydroxystyrene were heated on a hot plate for 90 seconds at 100° C. to form an upper resist layer 123 having a thickness of 100 nm.

Figure 13A:
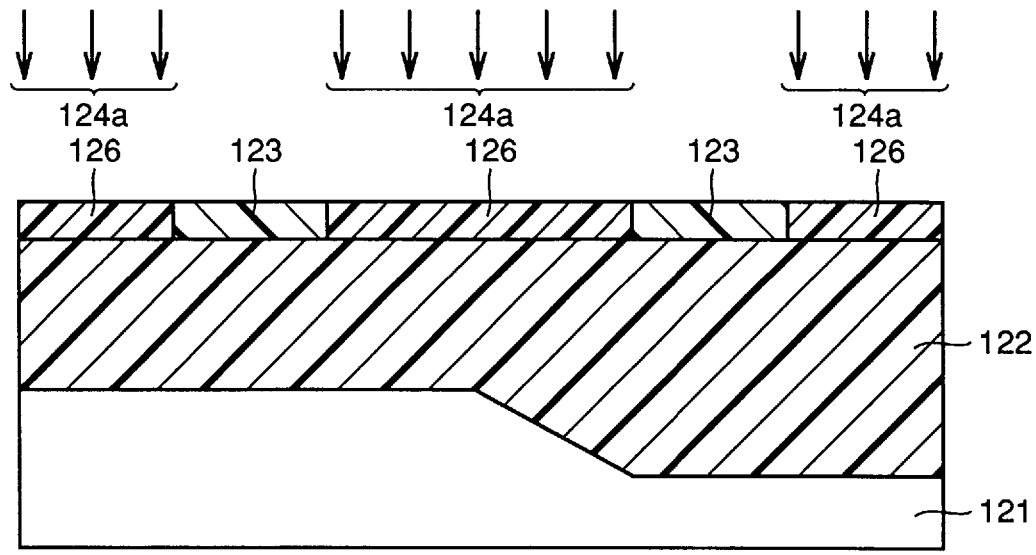
FIG. 13A is a cross sectional view showing a third step of a method of forming a pattern according to the example 5 of the present invention.

Referring to FIG. 13A, KrF excimer layer beams (wavelength of 248 nm) shown by arrows 124a were selectively directed with an energy of 10 mJ/cm²/pulse through a mask to upper resist layer 123 using a KrF excimer stepper (numerical aperture NA of a lens=0.50, σ=0.5). Thus, an un-silylatable layer 106 is formed.

Figure 14:
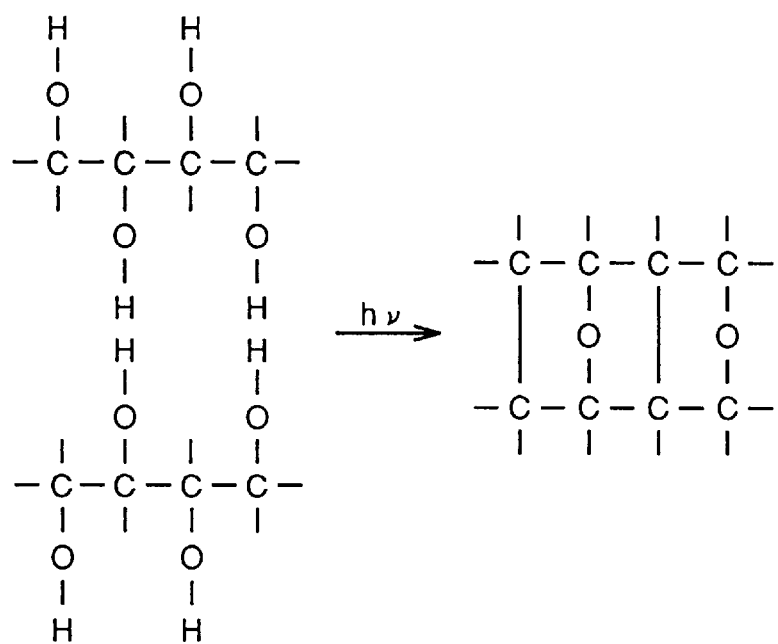
FIG. 14 is a diagram showing a chemical reaction of crosslinking.

Referring to FIG. 14, in un-silylatable layer 126, crosslinking occurs by the effect of KrF excimer laser beams (hv in the figure), so that OH groups disappear and a density of un-silylatable layer 106 is increased.

Figure 15:
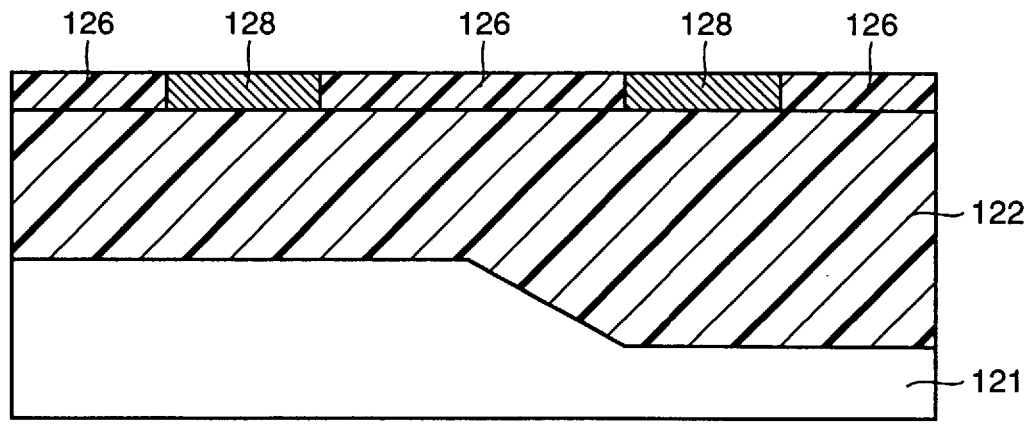

Referring to FIG. 15, silylation was carried out by making un-silylatable layer 106 and upper resist layer 123 (FIG. 13A) in contact with dimethylsilyldiethylamine vapor used as an organic metal reagent for 60 seconds in an atmosphere with a pressure of 40 Torr and at a temperature of 70° C. Thus, a silylated layer 128 was formed.

Figure 16:
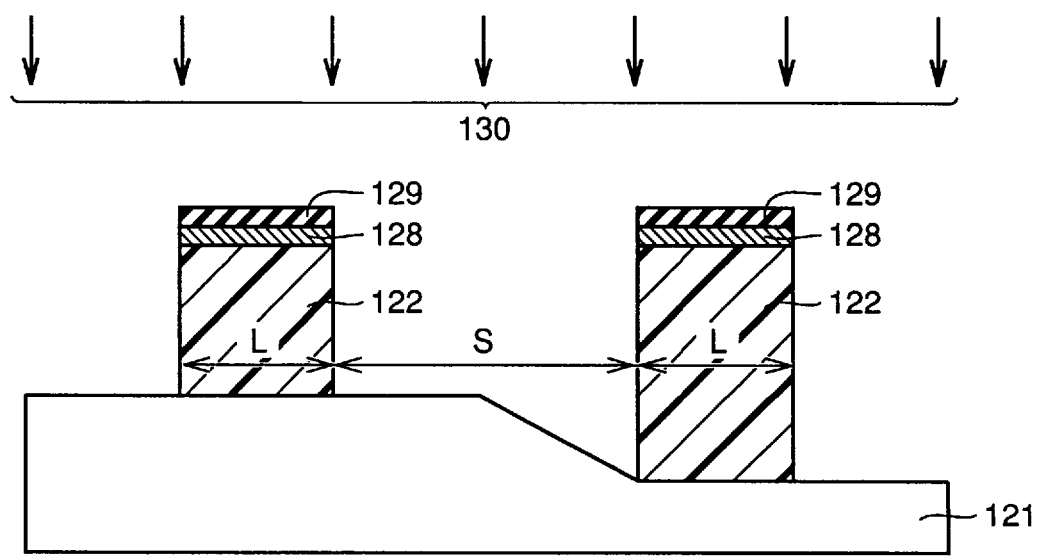

Referring to FIG. 16, dry etching was performed with oxygen plasma shown by arrows 130. A surface of silylated layer 128 reacted with oxygen plasma to form an oxide film 129. Since oxide film 129 provides a shield against oxygen plasma, silylated layer 128 was not etched. As a result, a positive pattern with a resolution of 0.18 $\mu$mL/S was obtained with a sensitivity of 1J/cm², where 0.18 $\mu$mL/S indicates L in FIG. 16=0.18 $\mu$m and S in FIG. 16=0.18 $\mu$m. Furthermore, this pattern had no scum and had a rectangular cross section. In addition, there was no halation caused by light reflection from a stepped portion of layer 121.

According to the present example, as shown in FIG. 12, since upper resist layer 123 as a silylatable layer has a thickness of 100 nm which is smaller than a thickness (200 to 220 nm) of a layer to be silylated in the conventional example, the volume of a portion to be silylated is small. Therefore, if upper resist layer 123 is silylated, silylated layer 128 (FIG. 15) will not swell so much as the conventional example. As a result, a fine pattern can be formed with high accuracy.

Furthermore, since swelling of silylated layer 128 can be prevented, silylated layer 128 has approximately the same thickness both at the center and at the end thereof. Therefore, the end of silylated layer 128 will not be etched, and a fine pattern can be formed with high accuracy.

Furthermore upper resist layer 123 as a silylatable layer is thinner than the conventional example, the volume of a portion to be silylated is small. Therefore, the amount of an organic metal reagent used for silylation can be reduced.

In addition, since upper resist layer 123 is thinner than the conventional example, KrF excimer laser beams shown by arrows 124 surely reach the bottom of un-silylatable layer 126 in the step shown in FIG. 13A, and the chemical reaction shown in FIG. 14 will occur in the entire un-silylatable layer 126. Thus, a density of un-silylatable layer 126 is increased and OH groups disappear from un-silylatable layer 126. Since dimethylsilyldiethylamine vapor does not diffuse into such high density un-silylatable layer 126, un-silylatable layer 126 will not be silylated. Furthermore, even if dimethylsilyldiethylamine vapor diffuses therein, un-silylatable layer 126 has few OH groups and therefore will not be silylated. As a result, un-silylatable layer 126 will not form an oxide film which provides a shield against oxygen plasma in the step shown in FIG. 16. Accordingly, un-silylatable layer 126 and lower resist layer 122 located thereunder are surely etched, so that generation of scum can be prevented.

In addition, in the case of reduction-type projection printing, since an optical reaction is carried out in an extremely thin layer, improvement in resolution and in depth of focus can be achieved.

Furthermore, polyhydroxystyrene which is general-purpose resin can be used as the upper resist layer, manufacturing cost can be reduced.

Furthermore, KrF excimer laser beams shown by arrows 124 is made to have an energy of 10 mJ/cm$^2$/pulse in the step shown in FIG. 13, whereby occurrence of the chemical reaction shown in FIG. 14 can be ensured even with a material having a low sensitivity.

[Example 6]

An Example 6 corresponds to the first and third embodiments.

Referring to FIG. 11, OFPR 800 (product name) was applied by spin coating on a layer 121 to be processed. OFPR 800 and layer 121 were heated on a hot plate for 120 seconds at a temperature of 200° C. to form a lower resist layer 122 having a thickness of 1 $\mu$m.

Referring to FIG. 12, polyvinyl alcohol was applied on lower resist layer 122 by spin coating. Layer 121, lower resist layer 122 and polyvinyl alcohol were heated on a hot plate for 90 seconds at 100° C. to form an upper resist layer 123 having a thickness of 30 nm. This upper resist layer 123 has a thickness of 30 nm and transmittance of at least 80% for light having a wavelength of at most 300 nm.

Figure 13B:
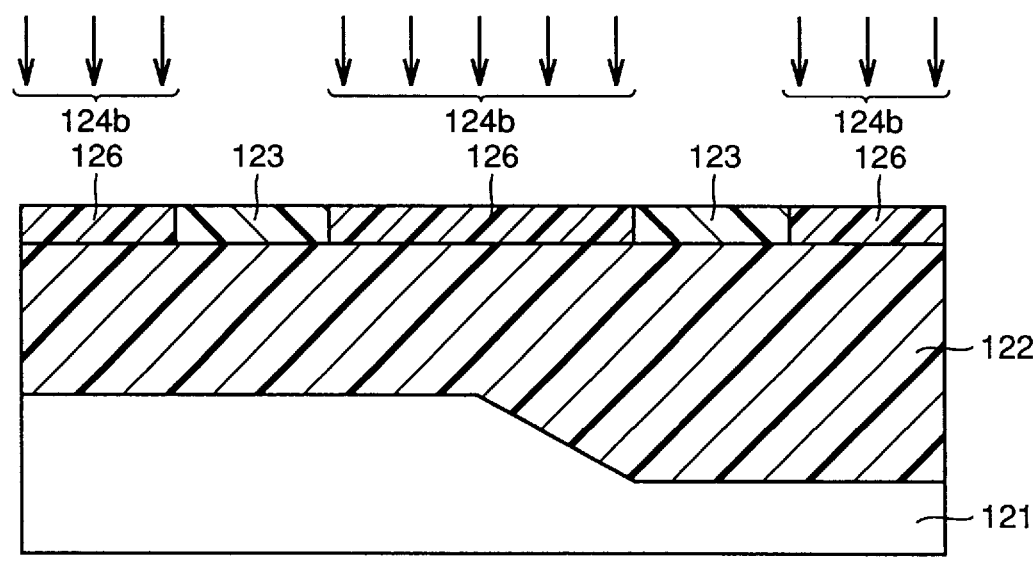
FIG. 13B is a cross sectional view showing a third step of a method of forming a pattern according to the example 6 of the present invention.

Referring to FIG. 13B, ArF excimer laser beams (wavelength of 193 nm) shown by arrows 124b were selectively directed through a mask to upper resist layer 123 using an ArF excimer stepper (numerical aperture NA of a lens= 0.50, σ=0.5). Thus, an un-silylatable layer 126 was formed.

Referring to FIG. 14, in un-silylatable layer 126, crosslinking occurs due to the effect of ArF excimer layer beams (hv in the figure) and OH groups disappear, so that a density of un-silylatable layer 126 is increased.

Referring to FIG. 15, silylation was carried out by making un-silylatable layer 126 and upper resist layer 123 (FIG. 13B) in contact with dimethylsilyldiethylamine vapor used as an organic metal reagent for 60 seconds in an atmosphere with a pressure of 40 Torr and at a temperature of 70° C. Thus, a silylated layer 128 was formed.

Referring to FIG. 16, dry etching was performed with oxygen plasma shown by arrows 130. A surface of silylated layer 128 reacted with oxygen plasma to form an oxide film 129. Since oxide film 129 provides a shield against oxide plasma, silylated layer 128 was not etched. As a result, a positive pattern with a resolution of 0.18 $\mu$mL/S was obtained. This pattern had no scum and had a rectangular cross section. Furthermore, there was no halation caused by light reflection from a stepped portion of layer 121.

According to the present example, as shown in FIG. 12, since upper resist layer 123 as a silylatable layer has a thickness of 100 nm which is smaller than a thickness (200 to 220 nm) of a layer to be silylated in the conventional example, the volume of a portion to be silylated is small. Therefore, when upper resist layer 123 is silylated, silylated layer 128 (FIG. 15) will not swell so much as the conventional example. As a result, a fine pattern can be formed with high accuracy.

Furthermore, since swelling of silylated layer 128 can be prevented, silylated layer 128 has approximately the same thickness both at the center and at the end thereof. Therefore, the end of silylated layer 128 will not be etched, and a fine pattern can be formed with high accuracy.

Furthermore, upper resist layer 123 as a silylatable layer is thinner than the conventional example, the volume of the portion to be silylated is small. Therefore, the amount of an organic metal reagent used for silylation can be reduced.

Furthermore, upper resist layer 123 is thin and has high light transmittance, ArF excimer laser beams 124b surely reach the bottom of un-silylatable layer 126 in the step shown in FIG. 13B. Therefore, occurrence of the reaction shown in FIG. 14 is ensured in the entire un-silylatable layer 126, so that a density of un-silylatable layer 126 is increased and OH groups disappear therefrom. Since dimethylsilyldiethylamine vapor does not diffuse into such high density un-silylatable layer 126, un-silylatable layer 126 will not be silylated. Furthermore, even if dimethylsilyldiethylamine vapor diffuses thereinto, un-silylatable layer 126 has few OH groups and therefore will not be silylated. As a result, un-silylatable layer 126 will not form an oxide film which provides a shield against oxide plasma in the step shown in FIG. 16. Therefore, un-silylatable layer 126 and lower resist layer 122 located thereunder are surely etched, so that generation of scum can be prevented.

In addition, in the case of reduction-type projection printing, since an optical reaction can be carried out in an extremely thin layer, improvement in resolution and in depth of focus can be achieved.

Furthermore, since polyhydroxystyrene which is general-purpose resin can be used as the upper resist layer, manufacturing cost can be reduced.

[Example 7]

An example 7 corresponds to the first and third embodiments.

Figure 17:
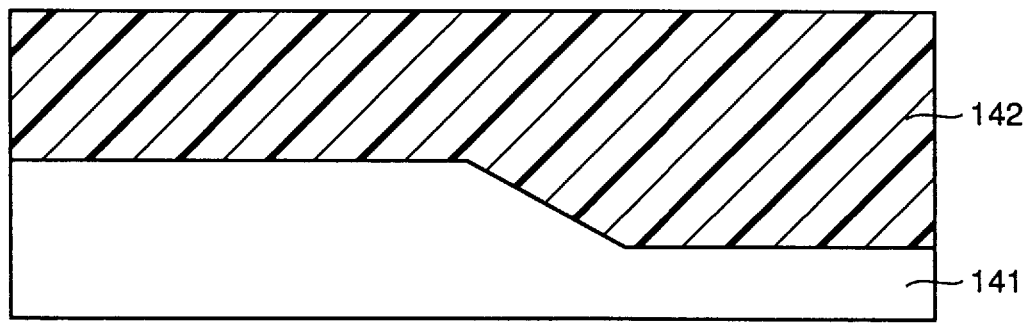
FIGS. 17 to 21 are cross sectional views respectively showing first to fifth steps of a method of forming a pattern according to an example 7 of the present invention.

Referring to FIG. 17, OFPR 800 (product name) was applied by spin coating on a layer 141 to be processed. OFPR 800 and layer 141 were heated on a hot plate for 120 seconds at a temperature of 200° C. to form a lower resist layer 142 having a thickness of 1 μm.

Figure 18:
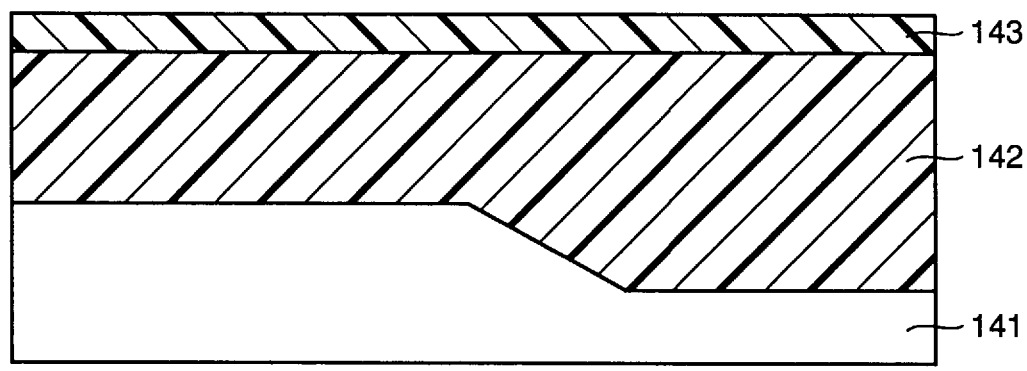

Referring to FIG. 18, polyhydroxystyrene which is general-purpose resin having OH groups was applied on lower resist layer 142 by spin coating. Layer 141, lower resist layer 142 and polyhydroxystyrene were heated on a hot plate for 90 seconds at 100° C. to form an upper resist layer 143 having a thickness of 50 nm.

Figure 19:
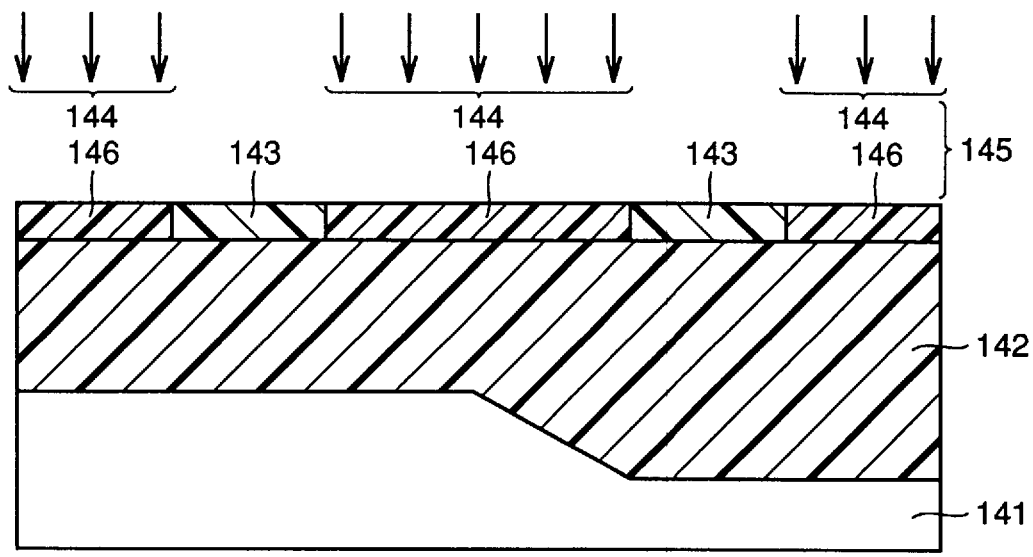

Referring to FIG. 19, KrF excimer laser beams (wavelength of 248 nm) shown by arrows 144 were selectively directed through a mask to upper resist layer 143 in nitrogen gas 145 as inert gas using a KrF excimer stepper (numerical aperture NA of a lens=0.50, σ=0.5). The KrF excimer laser beams had light intensity of 10 MJ/cm$^2$/pulse. Thus, an un-silylatable layer 146 was formed.

Referring to FIG. 14, in un-silylatable layer 146, crosslinking occurs due to the effect of the KrF excimer laser beams and OH groups therein disappear, so that a density of un-silylatable layer 146 is increased.

Figure 20:
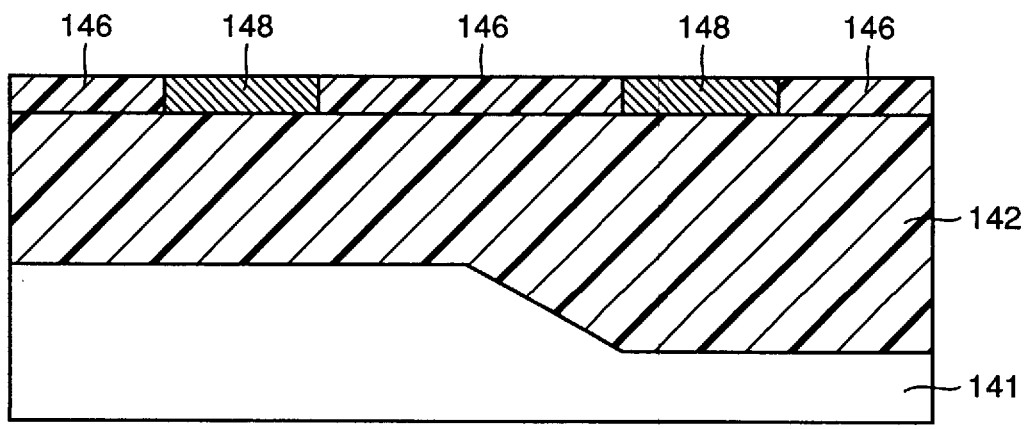

Referring to FIG. 20, silylation was carried out by making un-silylatable layer 146 and upper resist layer 143 (FIG. 19) in contact with dimethylsilyldiethylamine vapor used as an organic metal reagent for 60 seconds in an atmosphere with a pressure of 40 Torr and at a temperature of 70° C. Thus, a silylated layer 148 was formed.

Figure 21:
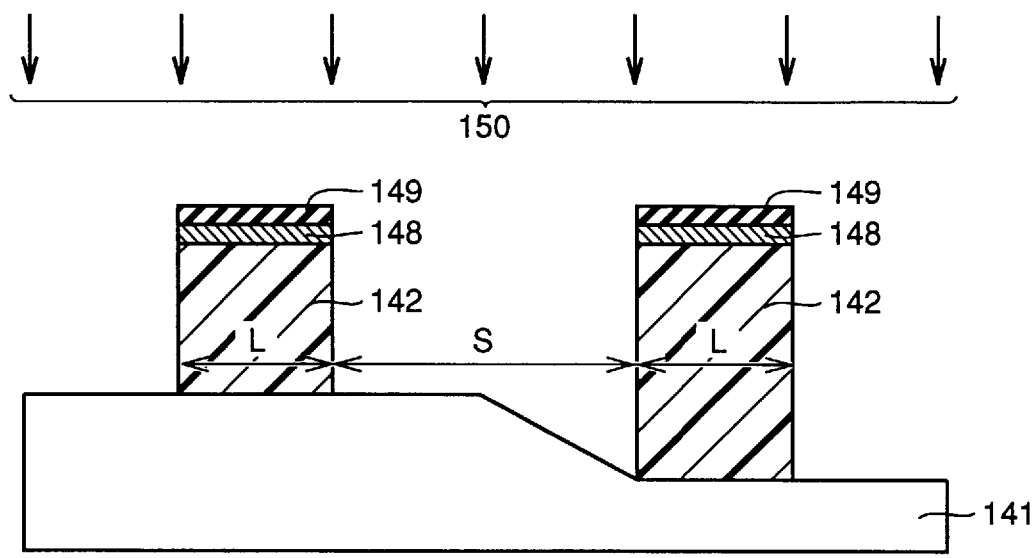

Referring to FIG. 21, dry etching was performed with oxygen plasma shown by arrows 150. A surface of silylated layer 148 reacted with oxygen plasma to form an oxide film 149. Since this oxide film 149 provides a shield against oxygen plasma, silylated layer 148 was not etched. As a result, a positive pattern with a resolution of 0.18 μmL/S was obtained, where 0.18 μmL/S indicates L in FIG. 21=0.18 μm and S in FIG. 21=0.18 μm. This pattern had no scum and had a rectangular cross section. Furthermore, there was no halation caused by light reflection from a stepped portion of layer 141.

According to the present example, as shown in FIG. 18, since upper resist layer 143 as a silylatable layer has a thickness of 50 nm which is smaller than a thickness (200 to 220 nm) of a layer to be silylated in the conventional example, the volume of a portion to be silylated is small. Therefore, when upper resist layer 143 is silylated, silylated layer 148 will not swell so much as the conventional example. As a result, a fine pattern can be formed with high accuracy.

In addition, since swelling of silylated layer 148 can be prevented, silylated layer 148 has approximately the same thickness both at the center and at the end thereof. Therefore, the end of silylated layer 148 will not be etched, and a fine pattern can be formed with high accuracy.

Furthermore, since upper resist layer 143 as a silylatable layer is thinner than the conventional example, the volume of the portion to be silylated is small. Therefore, the amount of an organic metal reagent used for silylation can be reduced.

Furthermore, since upper resist layer 143 is thinner than the conventional example, KrF excimer laser beams shown by arrows 144 surely reach bottom of un-silylatable layer 146 in the step shown in FIG. 19. Un-silylatable layer 146 is in contact with nitrogen gas 145. Therefore, the reaction shown in FIG. 14 occurs effectively in the entire un-silylatable layer 146, so that a density of un-silylatable layer 146 is increased and OH groups therein disappear. Since dimethylsilyldiethylamine vapor does not diffuse into such high density un-silylatable layer 146, un-silylatable layer 146 will not be silylated. Furthermore, even if dimethylsilyldiethylamine vapor diffuses therein, un-silylatable layer 146 has few OH groups and therefore will not be silylated. As a result, un-silylatable layer 146 will not form an oxide film which provides a shield against oxygen plasma in the step shown in FIG. 21. Therefore, un-silylatable layer 146 and lower resist layer 142 located thereunder are surely etched, so that generation of scum can be prevented.

In addition, in the case of reduction-type projection printing, since an optical reaction can be carried out in an extremely thin layer, improvement in resolution and in depth of focus can be achieved.

Furthermore, KrF excimer laser beams shown by arrows 144 are made to have an energy of 10 mJ/cm$^2$/pulse in the step shown in FIG. 19, whereby occurrence of the chemical reaction shown in FIG. 14 can be ensured even with a material with a low sensitivity.

[Example 8]

An example 8 corresponds to the fourth and fifth embodiments.

Figure 22:
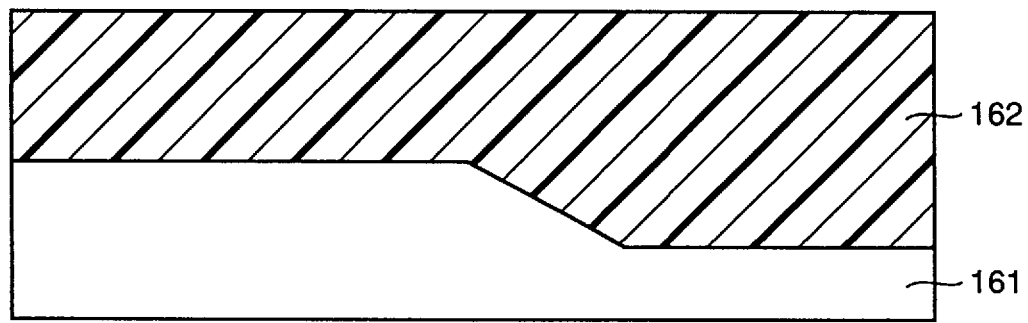
FIGS. 22 to 24, 26, 29 and 31 are cross sectional views respectively showing first to sixth steps of a method of forming a pattern according to an example 8 of the present invention.

Referring to FIG. 22, OFPR 800 (product name) was applied by spin coating on a layer 161 to be processed. OFPR 800 and layer 161 were heated on a hot plate for 120 seconds at a temperature of 200° C. to form a lower resist layer 162.

Figure 23:
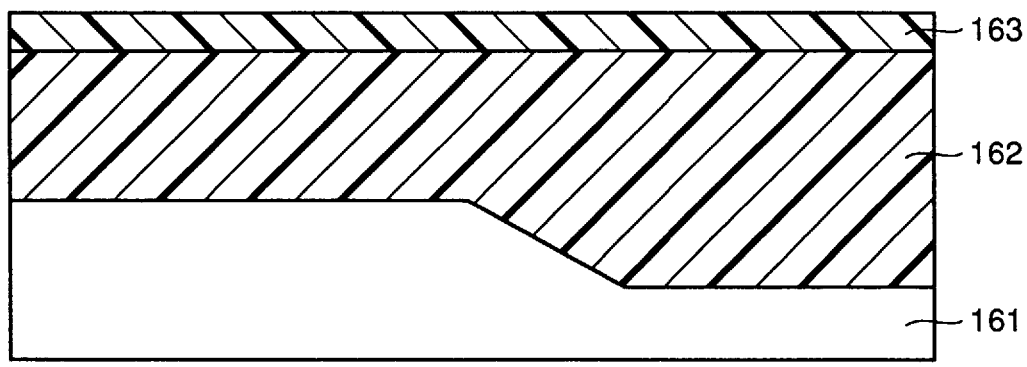

Referring to FIG. 23, Plasmask 301-U (product name) made by Japan Synthetic Rubber Co., Ltd. was applied on lower resist layer 162 by spin coating. Plasmask 301-U is formed of novolak resin and naphthoquinonediazide compound. Layer 161, lower resist layer 162 and Plasmask 301-U were heated on a hot plate for 90 seconds at 100° C. to form an upper resist layer 163 having a thickness of 40 nm.

Figure 24:
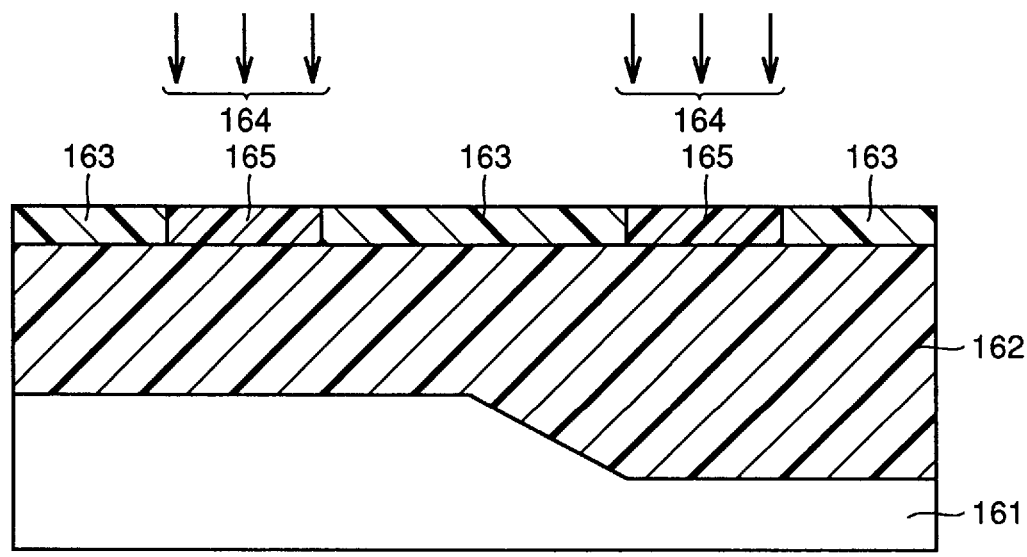

Referring to FIG. 24, KrF excimer laser beams (wavelength of 248 nm) shown by arrows 164 were selectively directed through a mask to upper resist layer 163 using a KrF excimer stepper (numerical aperture NA of a lens=0.50, σ=0.5). Thus, an exposed region 165 was formed.

Figure 25:
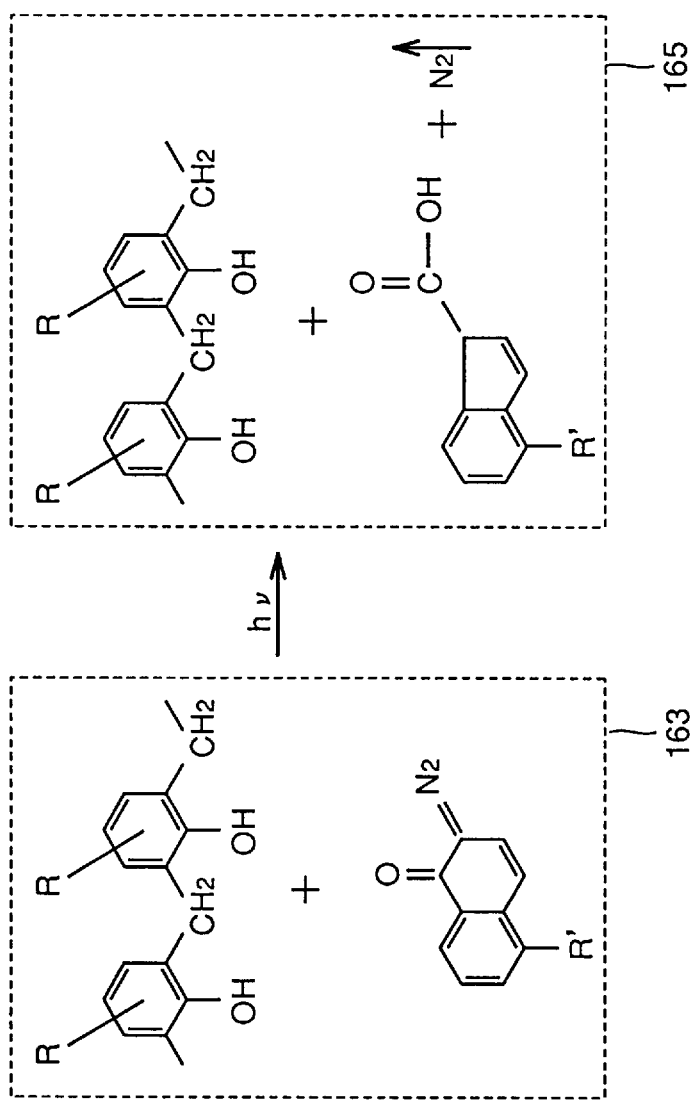
FIG. 25 is a diagram showing a chemical reaction which occurs in an exposed region 165 in FIG. 24.

Referring to FIG. 25, novolak resin constituting upper resist layer 163 will not cause a chemical reaction even if it is exposed to KrF excimer laser beams. On the other hand, naphthoquinonediazide produces a COOH group when it is exposed to KrF excimer laser beams.

Figure 26:
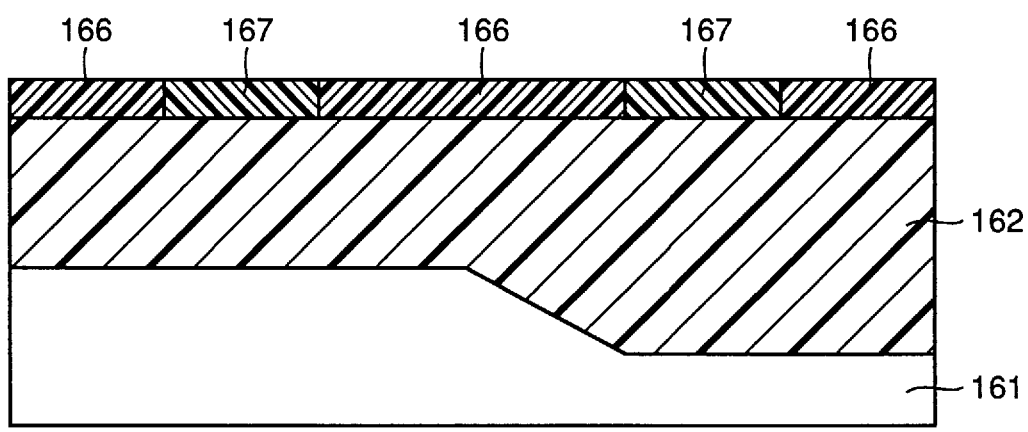

Referring to FIG. 26, heat treatment (pre-silylation baking) was carried out using a hot plate for 120 seconds at 150° to form an un-silylatable layer 166 and a silylatable layer 167. Both un-silylatable layer 166 and silylatable layer 167 had a thickness of 40 nm.

Figure 27:
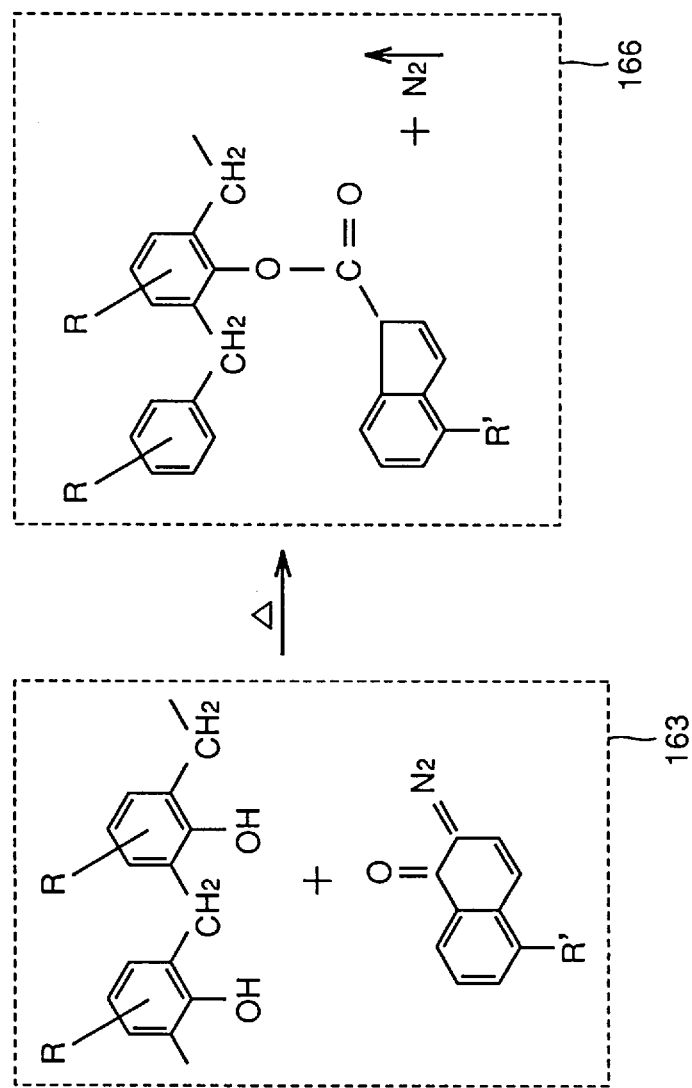
FIG. 27 is a diagram showing a chemical reaction which occurs in an un-silylatable layer 166 in FIG. 26.

Referring to FIG. 27, novolak resin and naphthoquinonediazide constituting upper resist layer 163 combined with each other by heating (Δ in the figure) to form un-silylatable layer 166. A material constituting un-silylatable layer 166 has no functional group which can be silylated such as an OH group and a COOH group. Therefore, un-silylatable layer 166 will not be silylated.

Figure 28:
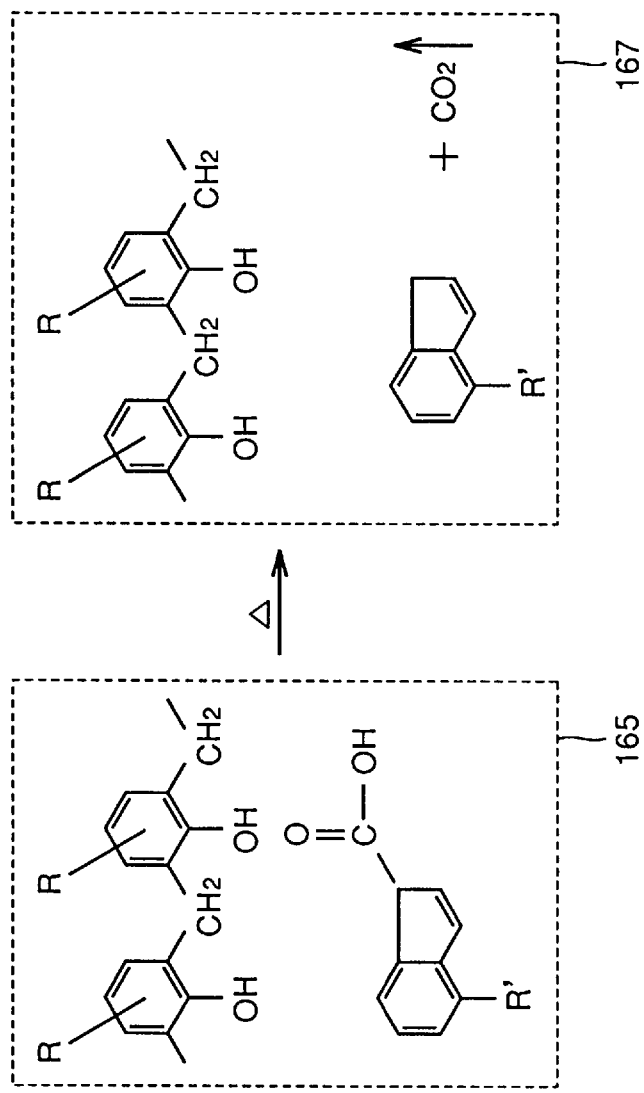
FIG. 28 is a diagram showing a chemical reaction which occurs in a silylatable layer 167 in FIG. 26.

Referring to FIG. 28, novolak resin constituting exposed region 165 will not be changed by heating. On the other hand, carboxylic acid constituting exposed region 165 is made to produce carbon dioxide by heating. At this time, novolak resin constituting silylatable layer 167 has OH groups. Therefore, silylatable layer 167 can be silylated.

Figure 29:
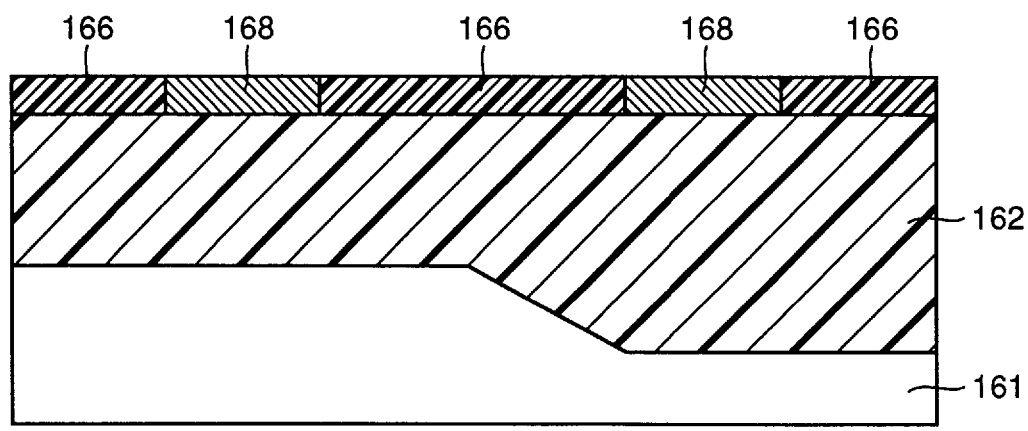

Referring to FIG. 29, silylation was carried out by making un-silylatable layer 166 and silylatable layer 167 (FIG. 26) in contact with dimethylsilyldiethylamine vapor used as an organic metal reagent for 60 seconds in an atmosphere with a pressure of 40 Torr and at a temperature of 70° C. Thus, a silylated layer 168 was formed.

Figure 30:
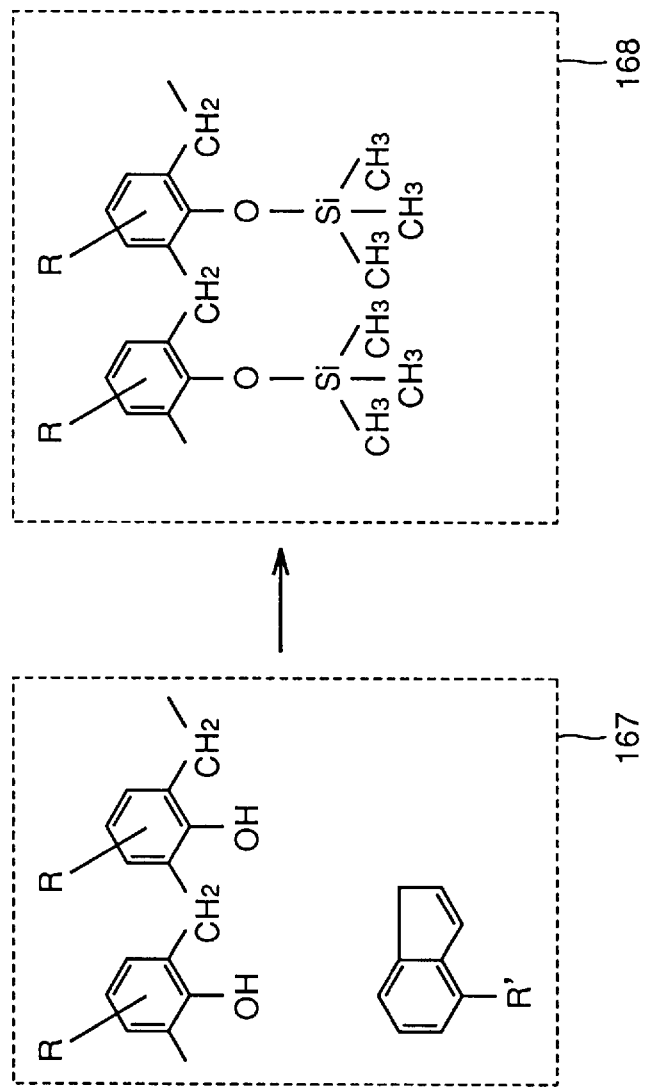
FIG. 30 is a diagram showing a chemical reaction which occurs in a silylated layer 168 in FIG. 29.

Referring to FIG. 30, H (hydrogen) leaves the OH groups in novolak resin constituting silylatable layer 167, and Si (silicon) and O in novolak resin bond to each other, whereby silylated layer 168 is formed.

Figure 31:
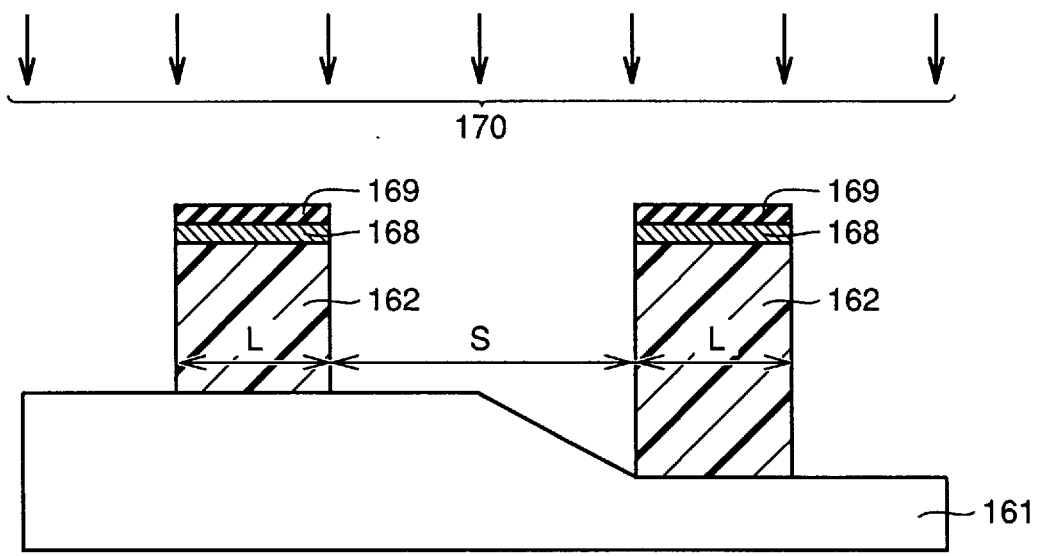

Referring to FIG. 31, dry etching was performed with oxygen plasma shown by arrows 170. A surface of silylated layer 168 reacted with oxygen plasma to form an oxide film 169. Since oxide film 169 provides a shield against oxide plasma, silylated layer 168 was not etched. As a result, a positive pattern with a resolution of 0.18 $\mu$mL/S was obtained, where 0.18 $\mu$mL/S indicates L in FIG. 31=0.18 $\mu$m and S in FIG. 31=0.18 $\mu$m. In addition, this pattern had no scum and had a rectangular cross section. Furthermore, there was no halation caused by light reflection from a stepped portion of layer 161.

According to the present example, as shown in FIG. 26, since silylatable layer 167 has a thickness of 40 nm which is smaller than a thickness (200 to 220 nm) of a layer to be silylated in the conventional example, the volume of a portion to be silylated is small. Therefore, when silylatable layer 167 is silylated, silylated layer 168 (FIG. 29) will not swell so much as the conventional example. As a result, a fine pattern can be formed with high accuracy.

Furthermore, since swelling of silylated layer 168 can be prevented, silylated layer 168 has approximately the same thickness both at the center and at the end thereof. Therefore, the end of silylated layer 168 will not be etched, and a fine pattern can be formed with high accuracy.

Furthermore, since silylatable layer 167 is thinner than the conventional example, the volume of the portion to be silylated is small. Therefore, the amount of an organic metal reagent used for silylation can be reduced.

Furthermore, since upper resist layer 163 is thinner than the conventional example, KrF excimer laser beams shown by arrows 164 reach the bottom of exposed region 165 in the step shown in FIG. 24, and the chemical reaction shown in FIG. 25 will occur in the entire exposed region 165. Therefore, when exposed region 165 is heated, occurrence of the chemical reaction shown in FIG. 27 is ensured in the entire exposed region 165, and OH groups disappear from un-silylatable layer 166. Therefore, even if un-silylatable layer 166 comes in contact with dimethylsilyldiethylamine vapor, it will not be silylated. As a result, un-silylatable layer 166 will not form an oxide film which provides a shield against oxygen plasma in the step shown in FIG. 31. Therefore, un-silylatable layer 166 and lower resist layer 162 located thereunder are surely etched, so that generation of scum can be prevented.

Furthermore, in the case of reduction-type projection printing, since an optical reaction can be carried out in an extremely thin layer, improvement in resolution and in depth of focus can be achieved.

[Example 9]

An example 9 corresponds to the fourth and sixth embodiments.

Figure 32:
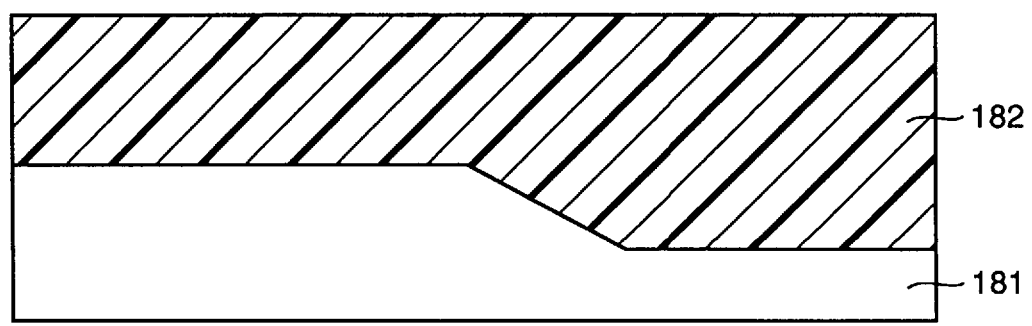
FIGS. 32 to 34, 36, 38 and 39 are cross sectional views respectively showing first to sixth steps of a method of forming a pattern according to an example 9 of the present invention.

Referring to FIG. 32, OFPR 800 (product name) was applied by spin coating on a layer 181 to be processed.

OFPR 800 and layer 181 were heated on a hot plate for 120 seconds at 200° C. to form a lower resist layer 182 having a thickness of 1 $\mu$m.

Figure 33:
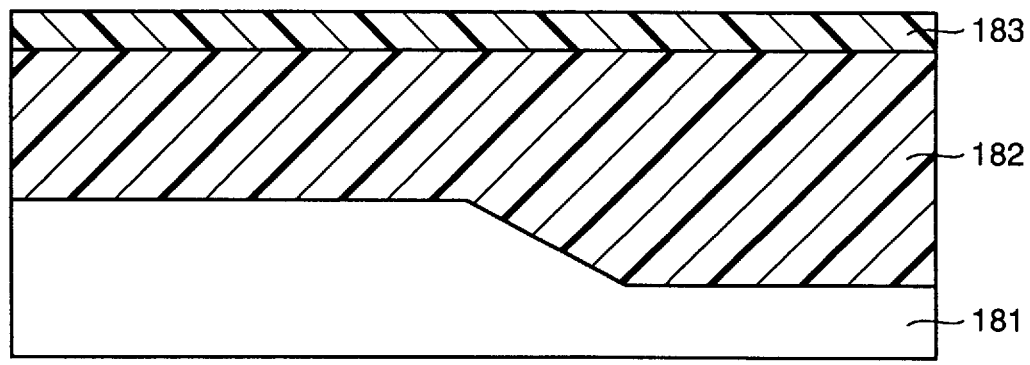

Referring to FIG. 33, chemical amplification-type positive resist containing both resin in which H of an OH group in polyhydroxystyrene has been replaced with a t-butoxycarbonyl group and triphenylsulfoniumtriflate was applied on lower resist layer 182 by spin coating. Layer 181, lower resist layer 182 and the chemical amplification-type positive resist were heated on a hot plate for 90 seconds at 100° C. to form an upper resist layer 183 having a thickness of 60 nm.

Figure 34:
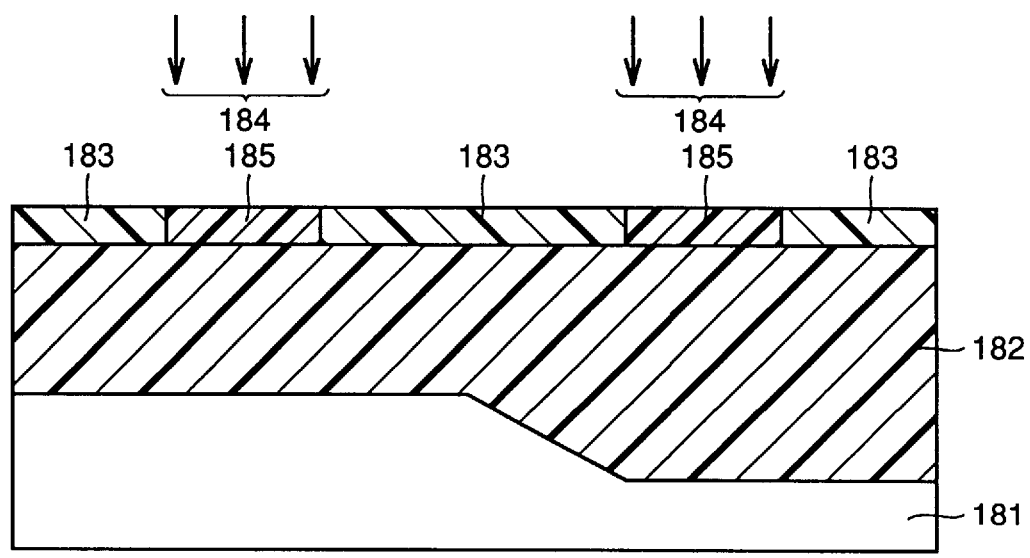

Referring FIG. 34, KrF excimer laser beams (wavelength of 248 nm) shown by arrows 184 were selectively directed through a mask to upper resist layer 183 using a KrF excimer stepper (numerical aperture NA of a lens=0.50, $\sigma$=0.5). Thus, an exposed region 185 was formed.

Figure 35:
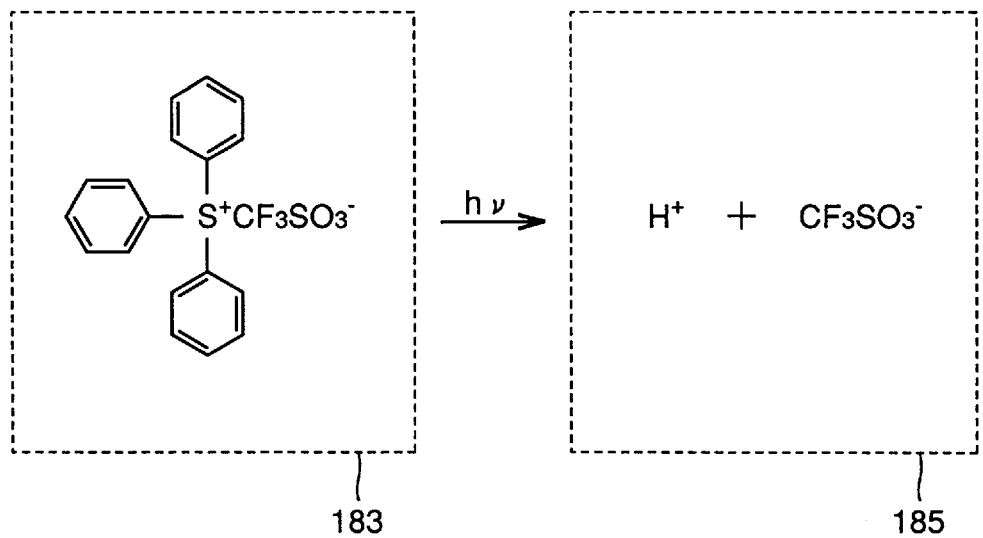
FIG. 35 is a diagram showing a chemical reaction which occurs in an exposed region 185 in FIG. 34.

Referring to FIG. 35, triphenylsulfoniumtriflate contained in upper resist layer 183 was decomposed by the effect of the KrF excimer laser beams to generate acid (H in the figure).

Figure 36:
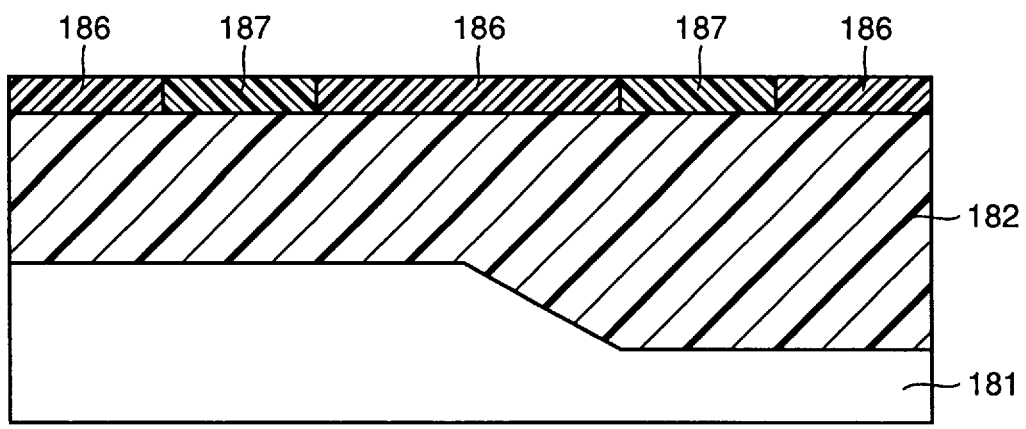

Referring to FIG. 36, heat treatment (post-exposure baking) was carried out using a hot plate for 90 seconds at 90° C. to form an un-silylatable layer 186 and a silylatable layer 187. Un-silylatable layer 186 and silylatable layer 187 had a thickness of 60 nm.

Figure 37:
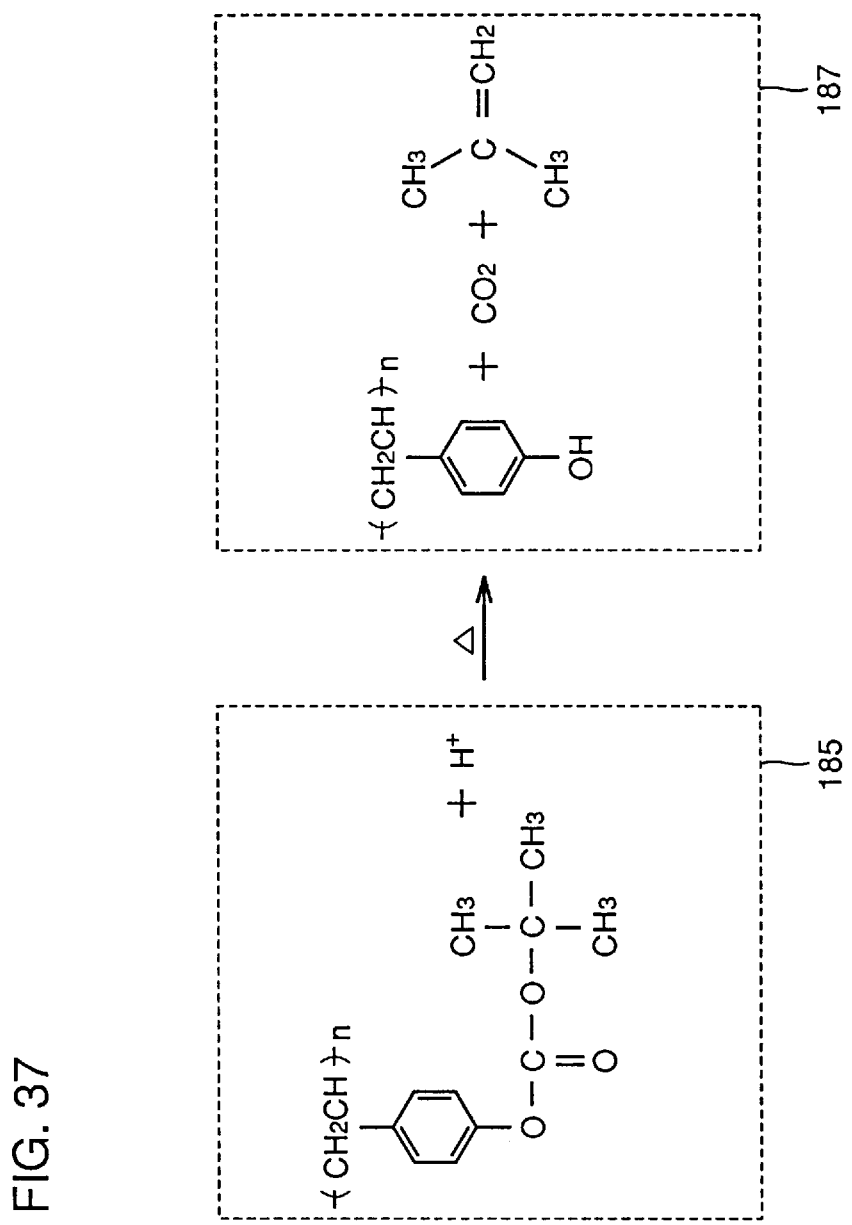
FIG. 37 is a diagram showing a chemical reaction which occurs in a silylatable layer 187 in FIG. 34.

Referring to FIG. 37, acid ($H^+$ in the figure) and t-butoxycarbonyl group contained in exposed region 185 reacts with each other to generate carbon dioxide and isobutene. Therefore, an OH group is produced in a material constituting silylatable layer 187.

Figure 38:
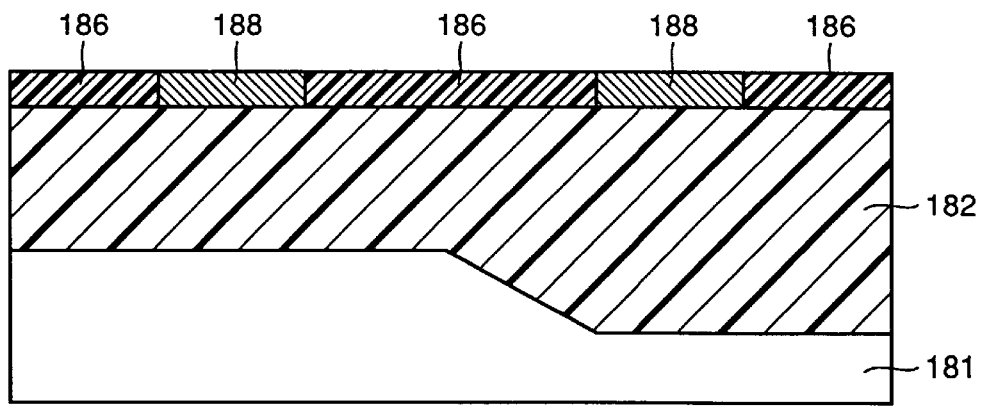

Referring to FIG. 38, silylation was carried out by making un-silylatable layer 186 and silylatable layer 187 (FIG. 36) in contact with dimethylsilyldiethylamine vapor used as an organic metal reagent for 60 seconds in an atmosphere with a pressure of 40 Torr and at a temperature of 70° C. Thus, a silylated layer 188 was formed.

Figure 39:
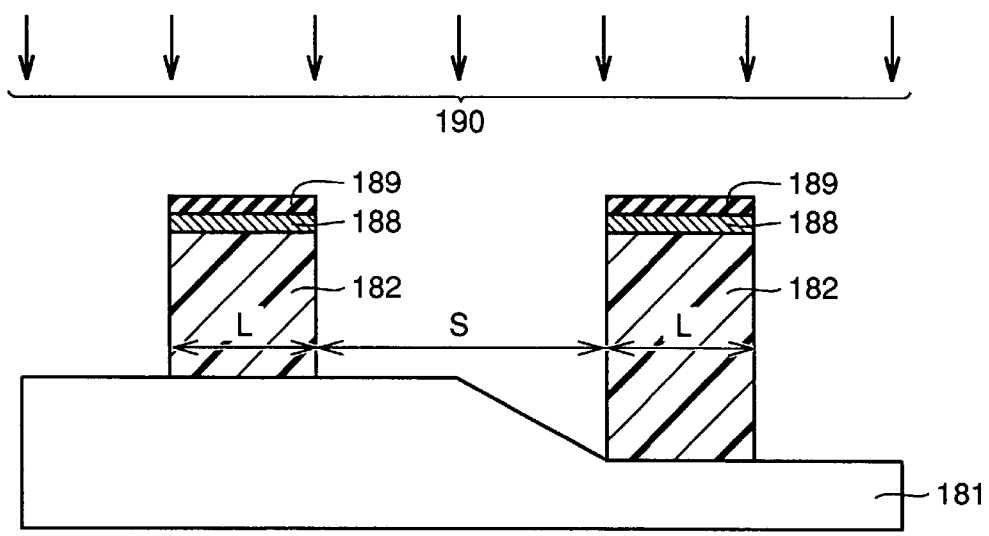

Referring to FIG. 39, dry etching was performed with oxygen plasma shown by arrows 190. A surface of silylated layer 188 reacted with oxygen plasma to form an oxide film 189. Since this oxide film 189 provides a shield against oxygen plasma, silylated layer 188 was not etched. As a result, a negative pattern with a resolution of 0.18 $\mu$mL/S was obtained, where 0.18 $\mu$mL/S indicates L in FIG. 39=0.18 $\mu$m and S in FIG. 39=0.18 $\mu$m. This pattern had no scum and had a rectangular cross section. Furthermore, there was no halation caused by light reflection from a stepped portion of layer 181.

According to the present example, as shown in FIG. 36, since silylatable layer 187 has a thickness of 60 nm which is smaller than a thickness (200 to 220 nm) of a layer to be silylated in the conventional example, the volume of a portion to be silylated is small. Therefore, when silylatable layer 187 is silylated, silylated layer 188 (FIG. 38) will not swell so much as the conventional example. As a result, a fine pattern can be formed with high accuracy.

Furthermore, since swelling of silylated layer 188 can be prevented, silylated layer 188 has approximately the same thickness both at the center and at the end thereof. Therefore, the end of silylated layer 188 will not be etched, and a fine pattern can be formed with high accuracy.

Furthermore, since silylatable layer 187 is thinner than the conventional example, the volume of the portion to be silylated is small. Therefore, the amount of an organic metal reagent used for silylation can be reduced.

Furthermore, since upper resist layer 183 is thinner than the conventional example, KrF excimer laser beams shown by arrows 184 surely reach the bottom of exposed region 185 in the step shown in FIG. 34, and the chemical reaction shown in FIG. 35 will occur in the entire exposed region 185. Therefore, when exposed region 185 is heated, occurrence of the chemical reaction shown in FIG. 37 is ensured in the entire exposed region 185 to produce an OH group in silylatable layer 187. As a result, silylatable layer 187 is surely silylated in the step shown in FIG. 38.

In addition, in the case of reduction-type projection printing, since an optical reaction can be carried out in an extremely thin layer, improvement in resolution and in depth of focus can be achieved. Furthermore, since a negative pattern can be obtained, further improvement in resolution can be expected by combination with a Levenson type phase shifting method. In addition, chemical amplification-type positive resist in a KrF excimer laser method which has been increasingly developed can be used.

[Example 10]

An example 10 corresponds to the fourth and seventh embodiments.

Figure 40:
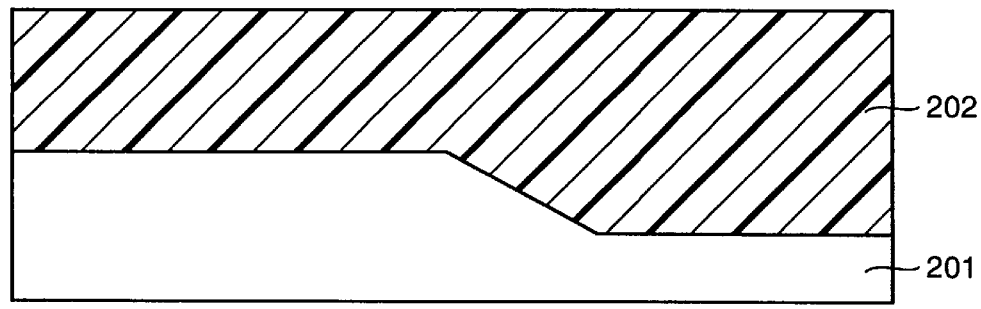
FIGS. 40 to 42 and 44 to 46 are cross sectional views respectively showing first to sixth steps of a method of forming a pattern according to an example 10 of the present invention.

Referring to FIG. 40, OFPR 800 (product name) was applied by spin coating on a layer 201 to be processed. OFPR 800 and layer 201 were heated on a hot plate for 120 seconds at 200° C. to form a lower resist layer 202 having a thickness of 1 μm.

Figure 41:
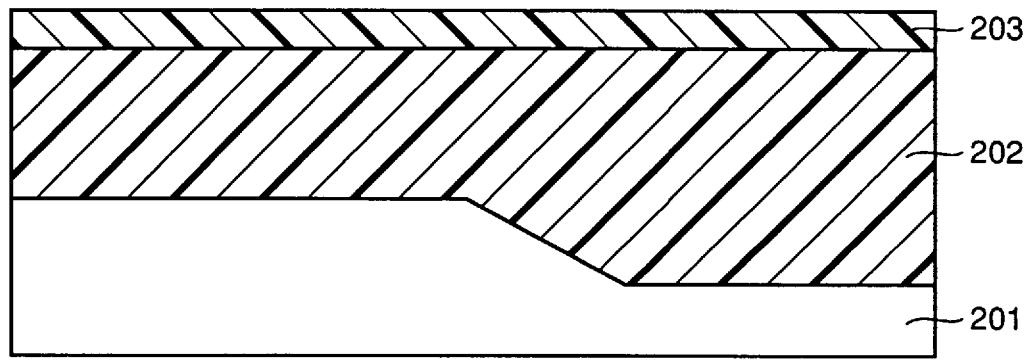

Referring to FIG. 41, THMR-iP3100 (product name) made by Tokyo Ohka Kogyo Co., Ltd. was applied on lower resist layer 202 by spin coating. Layer 201, lower resist layer 202 and THMR-iP3100 were heated on a hot plate for 90 seconds at 100° C. to form an upper resist layer 203 having a thickness of 70 nm.

Figure 42:
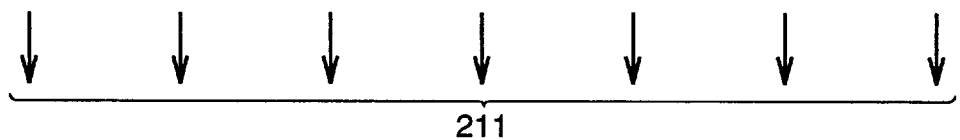
Figure 42:
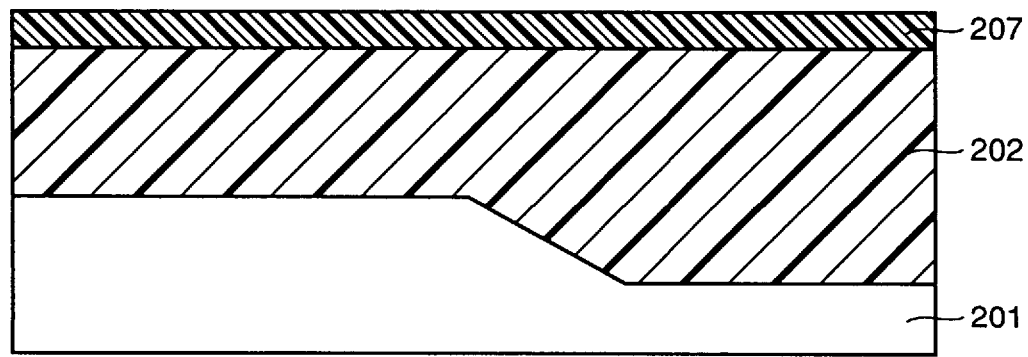

Referring to FIG. 42, i-line shown by arrows 211 was directed to upper resist layer 203 (FIG. 41) using an i-line stepper without a reticle. Thus, a silylatable layer 207 was formed. Silylatable layer 207 had a thickness of 70 nm.

Figure 43:
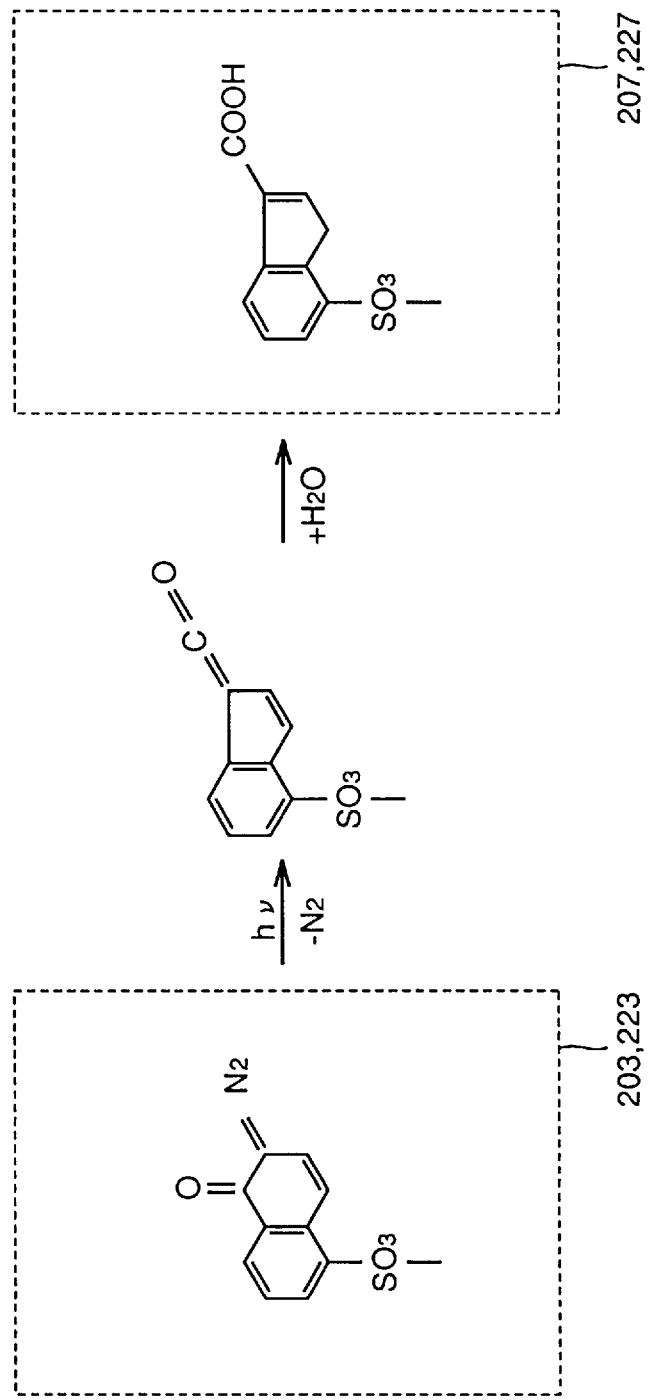
FIG. 43 is a diagram showing a chemical reaction which occurs in a silylatable layer 207 in FIG. 42 and an un-silylatable layer 227 in FIG. 49.

Referring to FIG. 43, naphthoquinonediazide contained in upper resist layer 203 partially becomes a COOH group by the effect of i-line. Therefore, there exists a COOH group in silylatable layer 207.

Figure 44:
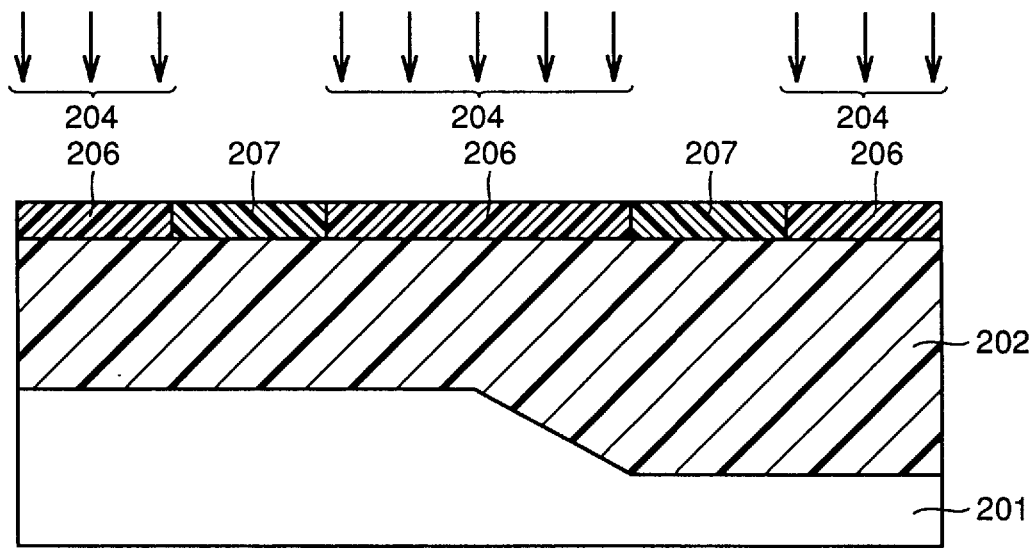

Referring to FIG. 44, KrF excimer laser beams (wavelength of 248 nm) shown by arrows 204 were selectively directed through a mask to silylatable layer 207 using a KrF excimer stepper (numerical aperture NA of a lens= 0.50, σ=0.5). Thus, an un-silylatable layer 206 was formed. At this time, in un-silylatable layer 206, crosslinking occurred in which an OH group in novolak resin and a COOH group produced by radiation of i-line bond to each other. Therefore, there is neither OH group nor COOH group in un-silylatable layer 206.

Figure 45:
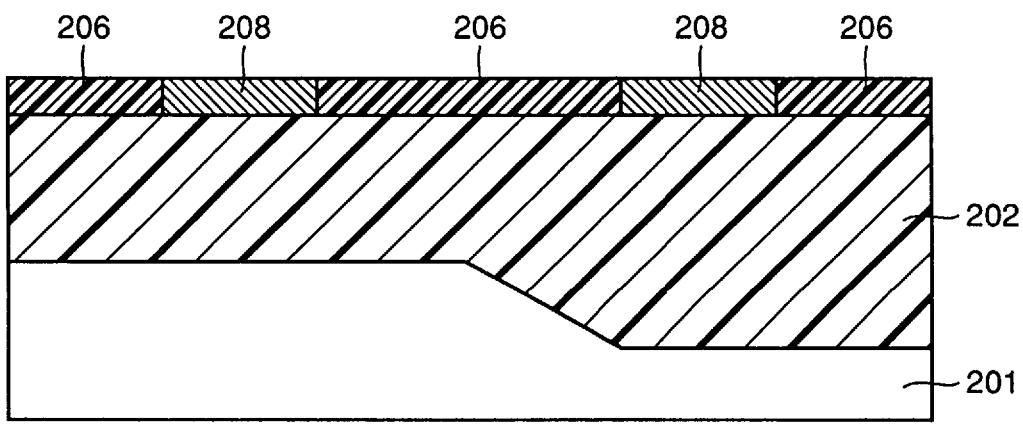

Referring to FIG. 45, silylation was carried out by making un-silylatable layer 206 and silylatable layer 207 (FIG. 44) in contact with dimethylsilyldiethylamine vapor used as an organic metal reagent for 60 seconds in an atmosphere with a pressure of 40 Torr and at a temperature of 70° C. Thus, a silylated layer 208 was formed.

Figure 46:
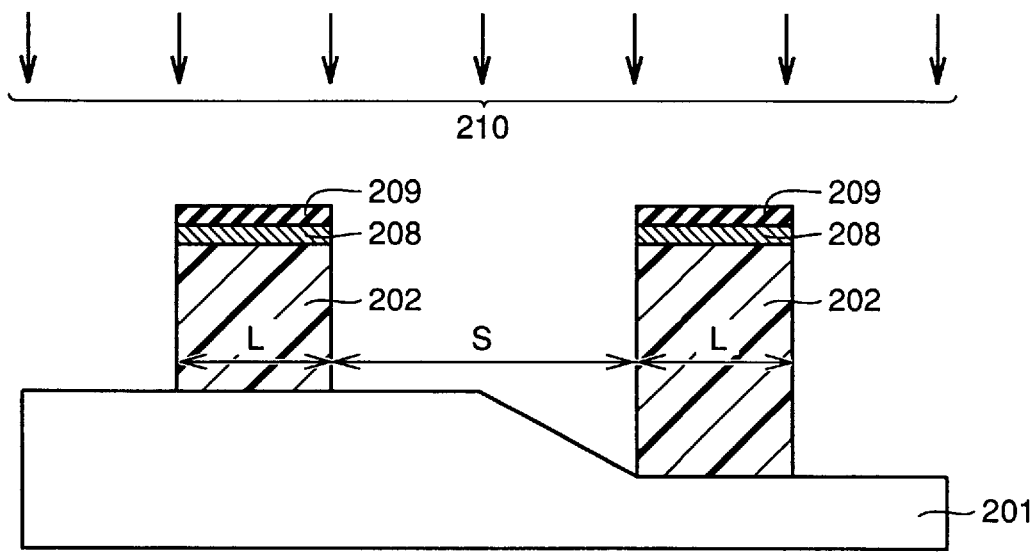

Referring to FIG. 46, dry etching was performed with oxygen plasma shown by arrows 210. A surface of silylated layer 208 reacted with oxygen plasma to form an oxide film 209. Since this oxide film 209 provides a shield against oxygen plasma, silylated layer 208 was not etched. As a result, a positive pattern with a resolution of 0.18 μmL/S was obtained, where 0.18 μmL/S indicates L in FIG. 46=0.18 μm and S in FIG. 46=0.18 μm. This pattern had no scum and had a rectangular cross section. Furthermore, there was no halation caused by light reflection from a stepped portion of layer 201.

According to the present example, as shown in FIG. 42, since silylatable layer 207 has a thickness of 70 nm which is smaller than a thickness (200 to 220 nm) of a layer to be silylated in the conventional example, the volume of a portion to be silylated is small. Therefore, when silylatable layer 207 is silylated, silylated layer 208 (FIG. 45) will not swell so much as the conventional example. As a result, a fine pattern can be formed with high accuracy.

In addition, since swelling of silylated layer 208 can be prevented, silylated layer 208 has approximately the same thickness both at the center and at the end thereof. Therefore, the end of silylated layer 208 will not be etched, and a fine pattern can be formed with high accuracy.

Furthermore, since silylatable layer 207 is thinner than the conventional example, the volume of the portion to be silylated is small. Therefore, the amount of an organic metal reagent used for silylation can be reduced.

Furthermore, since un-silylatable layer 206 is thinner than the conventional example, KrF excimer laser beams shown by arrows 204 surely reach the bottom of un-silylatable layer 206 in the step shown in FIG. 44. Therefore, crosslinking occurs in the entire un-silylatable layer 206, and OH groups and COOH groups disappear from un-silylatable layer 206. As a result, un-silylatable layer 206 will not be silylated in the step shown in FIG. 45. Therefore, un-silylatable layer 206 will not form an oxide film which provides a shield against oxygen plasma in the step shown in FIG. 46. Accordingly, un-silylatable layer 206 and lower resist layer 202 located thereunder are surely etched, so that generation of scum can be prevented. In addition, in the case of reduction-type projection printing, since an optical reaction can be carried out in an extremely thin layer, improvement in resolution and in depth of focus can be achieved.

Furthermore, since general-purpose photoresist can be used as the upper resist layer, manufacturing cost can be reduced.

[Example 11]

An Example 11 corresponds to the fourth and seventh embodiments.

Figure 47:
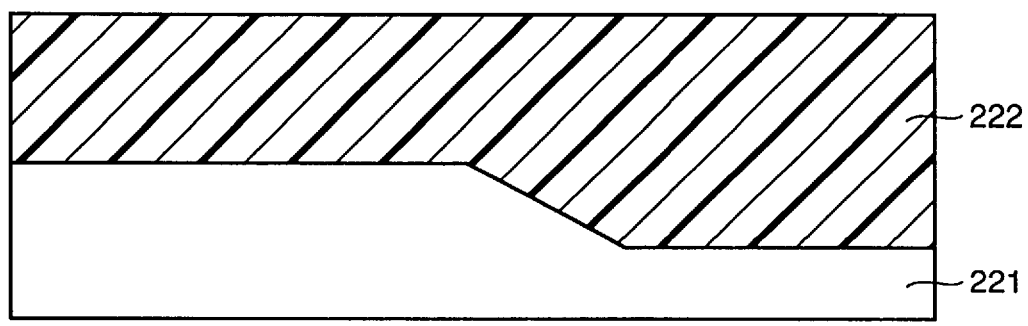
FIGS. 47 to 52 are cross sectional views respectively showing first to sixth steps of a method of forming a pattern according to an example 11 of the present invention.

Referring to FIG. 47, OFPR 800 (product name) was applied by spin coating on a layer 221 to be processed. OFPR 800 and layer 221 were heated on a hot plate for 120 seconds at 200° C. to form a lower resist layer 222 having a thickness of 1 μm.

Figure 48:
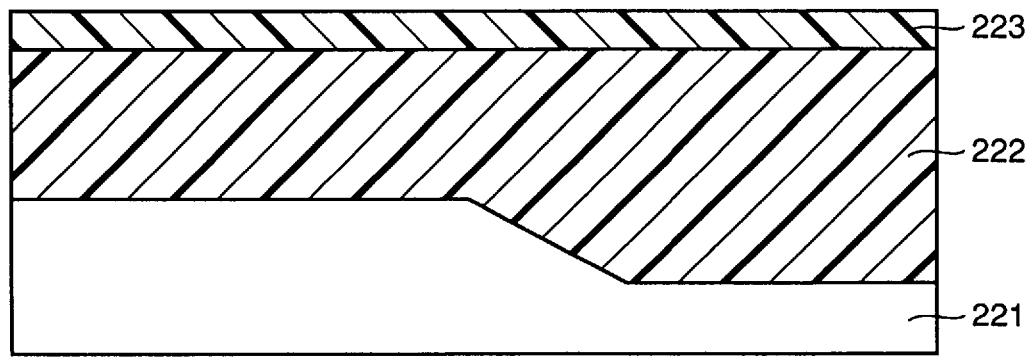

Referring to FIG. 48, THMR-iP3100 (product name) was applied on lower resist layer 222 by spin coating. Layer 221, lower resist layer 222 and THMR-iP3100 were heated for 90 seconds at 100° C. to form an upper resist layer 223 having a thickness of 80 nm.

Figure 49:
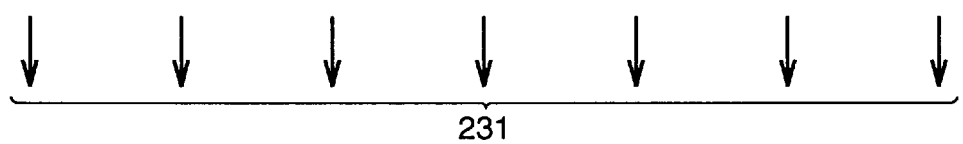
Figure 49:
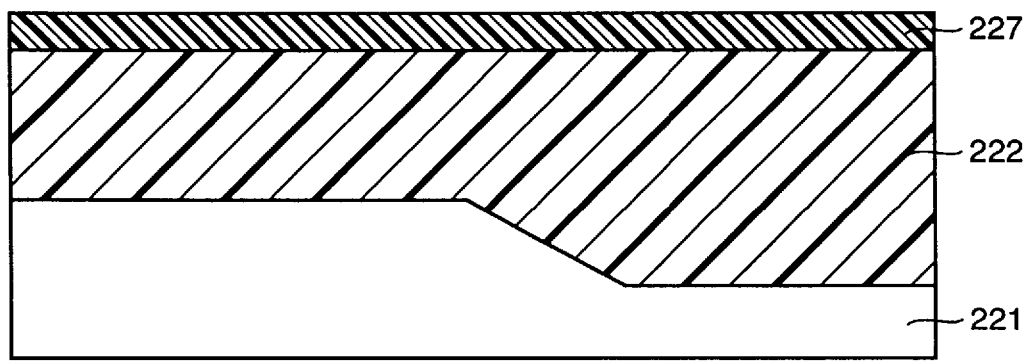

Referring to FIG. 49, i-line shown by arrows 231 was directed to upper resist layer 223 (FIG. 48) using an i-line stepper without a reticle. Thus, a silylatable layer 227 was formed. Silylatable layer 227 had a thickness of 80 nm.

Referring to FIG. 43, naphthoquinonediazide contained in upper resist layer 223 was partially changed into a COOH group by the effect of i-line.

Figure 50:
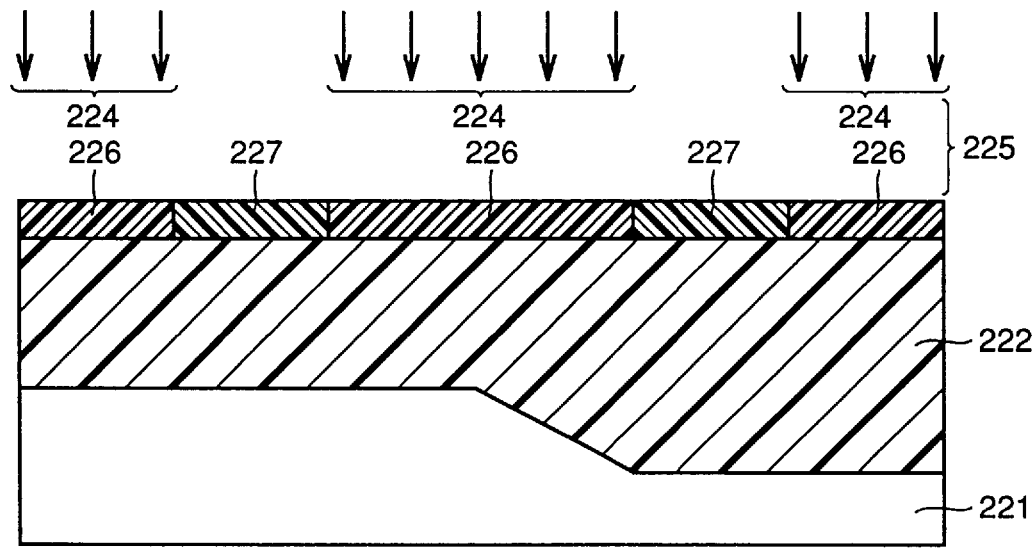

Referring to FIG. 50, KrF excimer laser beams (wavelength of 248 nm) shown by arrows 224 were selectively directed through a mask to silylatable layer 227 in nitrogen gas 225 as inert gas using a KrF excimer stepper (numerical aperture NA of a lens=0.50, σ=0.5). Thus, an un-silylatable layer 226 was formed. At this time, in un-silylatable layer 206, crosslinking occurred in which an OH group in novolak resin and a COOH group generated by radiation of i-line bond to each other. Therefore, there is neither OH group nor COOH group in un-silylatable layer 206.

Figure 51:
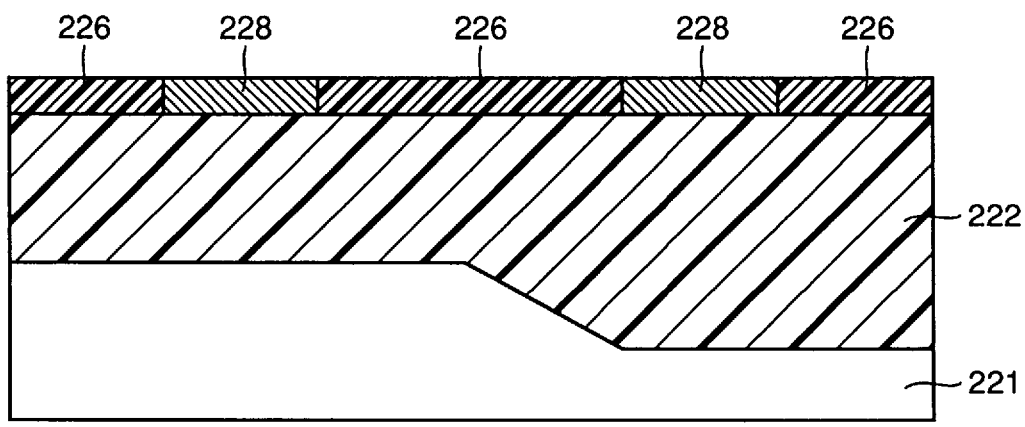

Referring to FIG. 51, silylation was carried out by making un-silylatable layer 226 and silylatable layer 227 (FIG. 50) in contact with dimethylsilyldiethylamine vapor used as an organic metal reagent for 60 seconds in an atmosphere with a pressure of 40 Torr and at a temperature of 70° C. Thus, a silylated layer 228 was formed.

Figure 52:
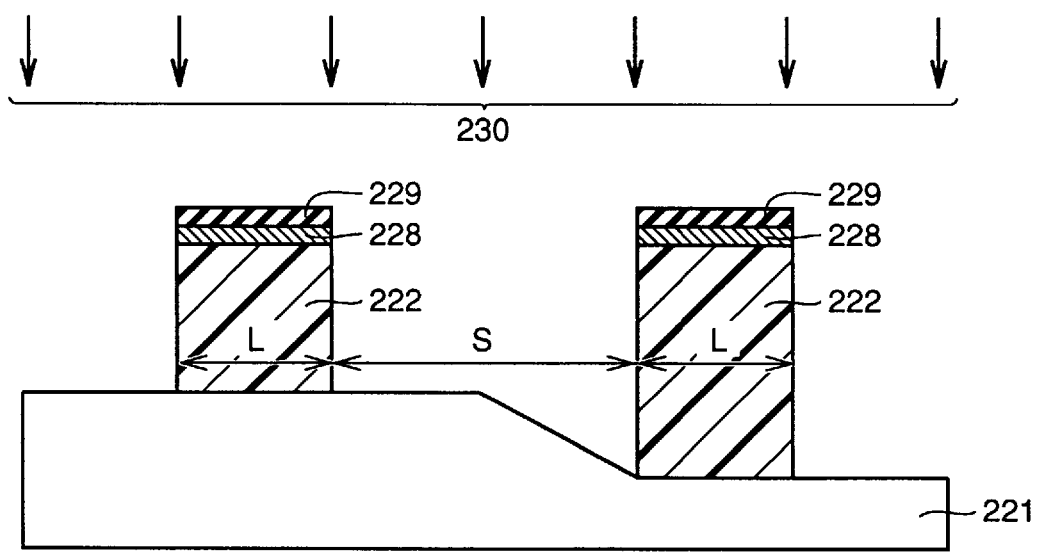

Referring to FIG. 52, dry etching was performed with oxygen plasma shown by arrows 230. A surface of silylated layer 228 reacted with oxygen plasma to form an oxide film 229. Since this oxide film 229 provides a shield against oxygen plasma, silylated layer 228 was not etched. As a result, a positive pattern with a resolution of 0.18 $\mu$L/S was obtained with a sensitivity of 150 mJ/cm$^2$, where 0.18 $\mu$L/S indicates L in FIG. 52=0.18 $\mu$m and S in FIG. 52=0.18 $\mu$m. This pattern had no scum and had a rectangular cross section. Furthermore, there was no halation caused by light reflection from a stepped portion of layer 221.

According to the present example, as shown in FIG. 49, since silylated layer 227 has a thickness of 80 nm which is smaller than a thickness (200 to 220 nm) of a layer to be silylated in the conventional example, the volume of a portion to be silylated is small. Therefore, when silylatable layer 227 is silylated, silylated layer 228 (FIG. 51) will not swell so much as the conventional example. As a result, a form pattern can be formed with high accuracy.

Furthermore, swelling of silylated layer 228 can be prevented, silylated layer 228 has approximately the same thickness both at the center and at the end thereof. Therefore, the end of silylated layer 228 will not be etched, and a fine pattern can be formed with high accuracy.

Furthermore, since silylatable layer 227 is thinner than the conventional example, the volume of the portion to be silylated is small. Therefore, the amount of an organic metal reagent used for silylation can be reduced.

Furthermore, since un-silylatable layer 226 is thinner than the conventional example, KrF excimer laser beams shown by arrows 224 surely reach the bottom of un-silylatable layer 226 in the step shown in FIG. 50. Therefore, crosslinking occurs in the entire un-silylatable layer 226, and an OH group and a COOH group disappear from un-silylatable layer 226. Therefore, un-silylatable layer 226 will not be silylated in the step shown in FIG. 51. As a result, un-silylatable layer 226 will not form an oxide film which provides a shield against oxygen plasma in the step shown in FIG. 52. Accordingly, un-silylatable layer 226 and lower resist layer 222 located thereunder are surely etched, so that generation of scum can be prevented.

In addition, in the case of reduction-type projection printing, since an optical reaction can be carried out in an extremely thin layer, improvement in resolution and in depth of focus can be achieved.

Furthermore, since general-purpose resist can be used as upper resist layer 223, manufacturing cost can be reduced.

Furthermore, since KrF excimer laser beams shown by arrows 224 are directed in nitrogen gas 225 as inert gas in the step shown in FIG. 50, crosslinking can be facilitated.

[Example 12]

An example 12 corresponds to the first and second embodiments.

Referring to FIG. 3, OFPR 800 (product name) was applied by spin coating and a layer 101 to be processed. OFPR 800 and layer 101 were heated on a hot plate for 120 seconds at 200° C. to form a lower resist layer 102 having a thickness of 1 $\mu$m.

Referring to FIG. 4, SNR 200 (product name) was applied on lower resist layer 102 by spin coating. Layer 101, lower resist layer 102 and SNR 200 were heated on a hot plate for 90 seconds at 100° C. to form an upper resist layer 103 having a thickness of 20 nm. Similarly, samples each with upper resist layer 103 having a different thickness were formed. The thickness of each upper resist layer 103 of thus formed samples will be shown in the following Table 1.

TABLE 1

| Sample No. | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Thickness (nm) of upper resist layer | 20 | 25 | 30 | 40 | 50 | 60 | 70 | 80 | 90 | 100 | 110 | 120 | 130 | 140 | 150 |

Standard deviation a of the thickness of each upper resist layer 103 in the samples was calculated. The standard deviation σ is given by the following equation:

$$(\text{standard deviation}) = \frac{\Sigma |(\text{mean value of thickness of upper resist layer}) - (\text{thickness of upper resist layer at measurement point})|}{n}$$

Figure 53:
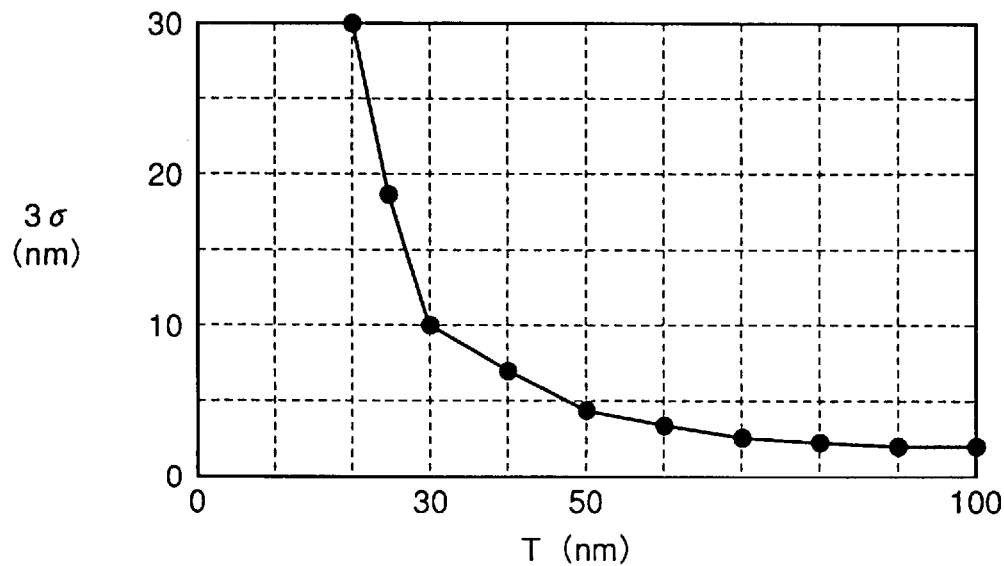
FIG. 53 is a graph showing a relationship between a thickness of an upper resist layer of a sample obtained by the example 12 of the present invention and a standard deviation thereof.

Referring to FIG. 53, it can be seen that a value of the standard deviation is increased when a thickness is less than 30 nm. In other words, it can be said that a thickness of upper resist layer 103 is not uniform if the thickness is less than 30 nm.

Referring to FIG. 5, for each of the samples 1 to 15, KrF excimer laser beams (wavelength of 248 nm) shown by arrows 104 were selectively directed through a mask to upper resist layer 103 using a KrF excimer stepper (numerical aperture NA of a lens=0.50, σ=0.5). Thus, an un-silylatable layer 105 was formed.

Referring to FIG. 6, for each of the samples 1 to 15, heat treatment was carried out using a hot plate for 120 seconds at 105° C. to form an un-silylatable layer 106 and a silylatable layer 107. Referring to FIG. 8, for each of the samples 1 to 15, silylation was carried out by making un-silylatable layer 106 and silylatable layer 107 (FIG. 6) in contact with dimethylsilyldiethylamine vapor used an organic metal reagent for 60 seconds in an atmosphere with a pressure of 40 Torr and at a temperature of 70° C. Thus, a silylated layer 108 was formed.

Referring to FIG. 9, for each of the samples 1 to 15, dry etching was performed with oxygen plasma shown by arrows 110. A surface of silylated layer 108 reacted with oxygen plasma to form an oxide film 109. Since this oxide film 109 provides a shield against oxygen plasma, silylated layer 108 was not etched. Thus, a pattern was formed in each of the samples 1 to 15.

Figure 54:
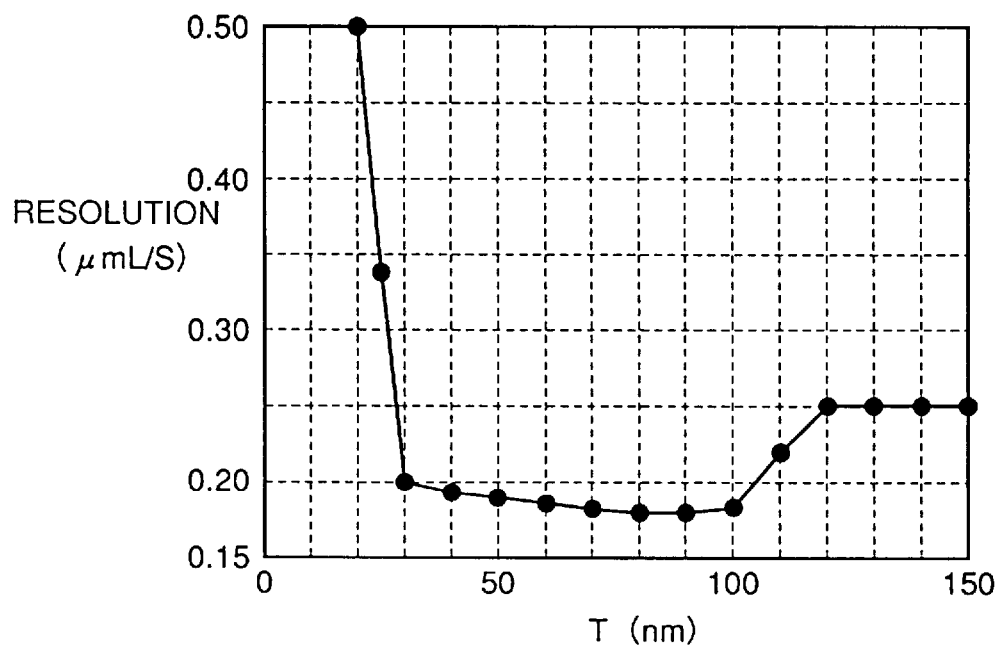
FIG. 54 is a graph showing a relationship between the thickness of the upper resist layer of the sample obtained by the example 12 of the present invention and resolution.
Figure 55:
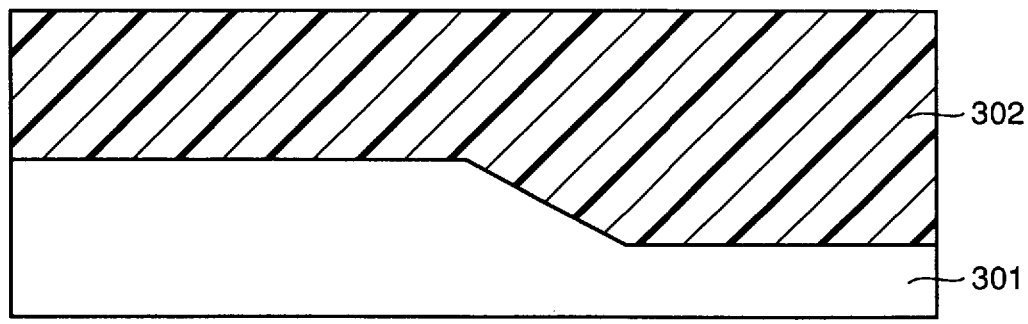
FIGS. 55 to 60 are cross sectional views respectively showing first to sixth steps of a conventional method of forming a pattern.
Figure 56:
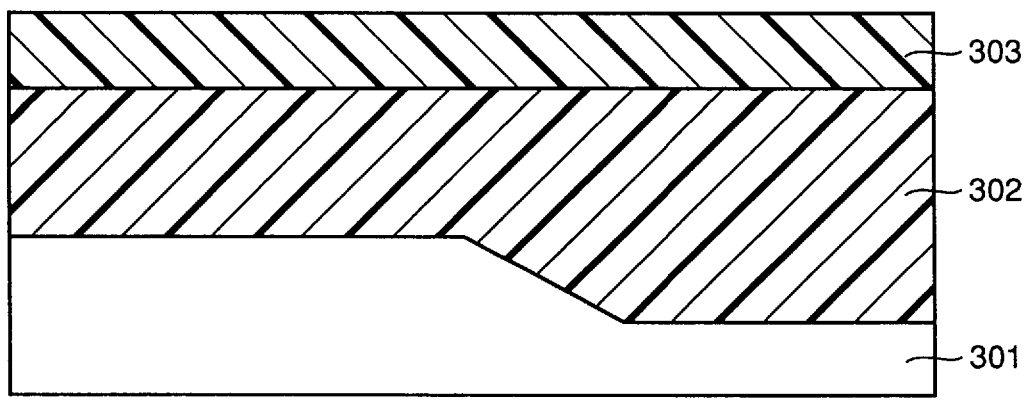
Figure 57:
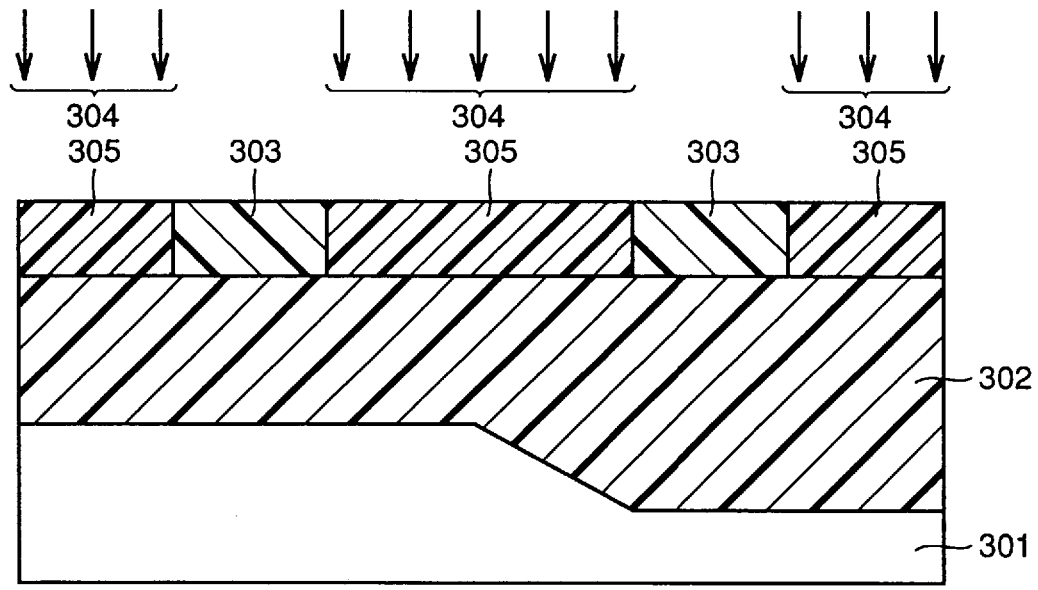
Figure 58:
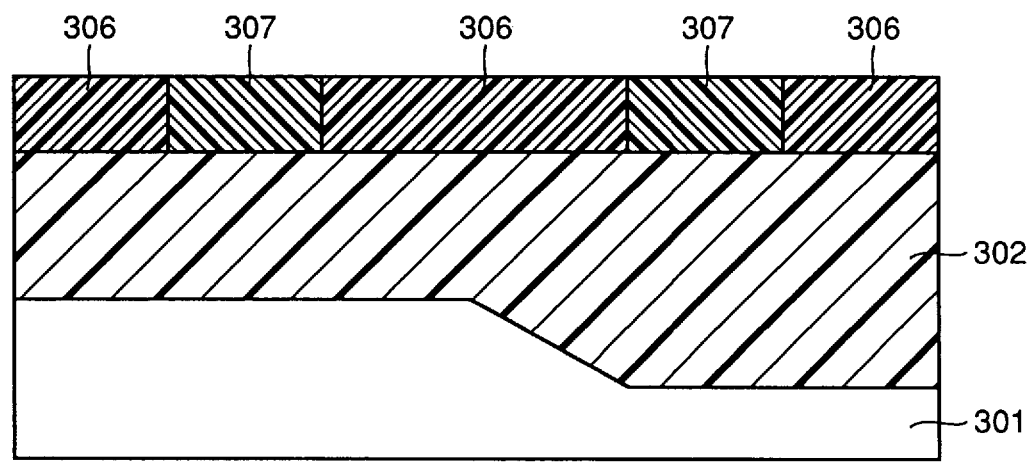
Figure 59:
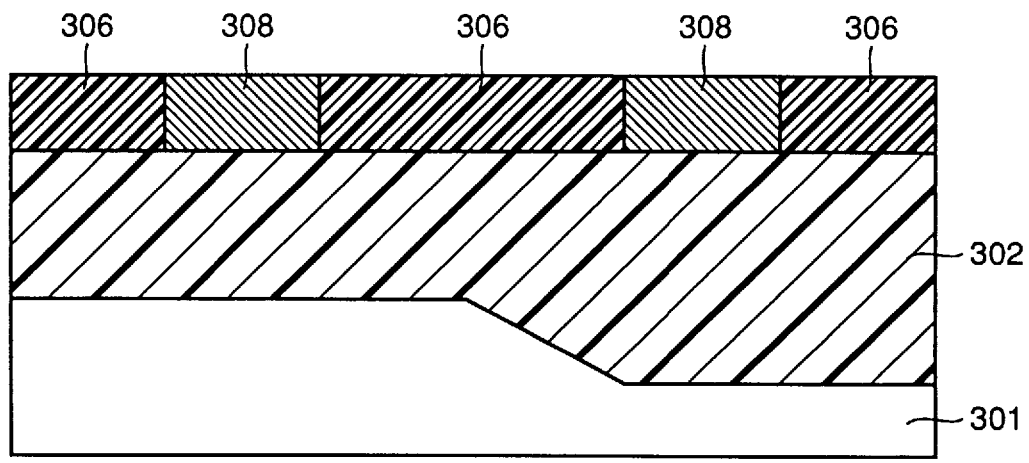
Figure 60:
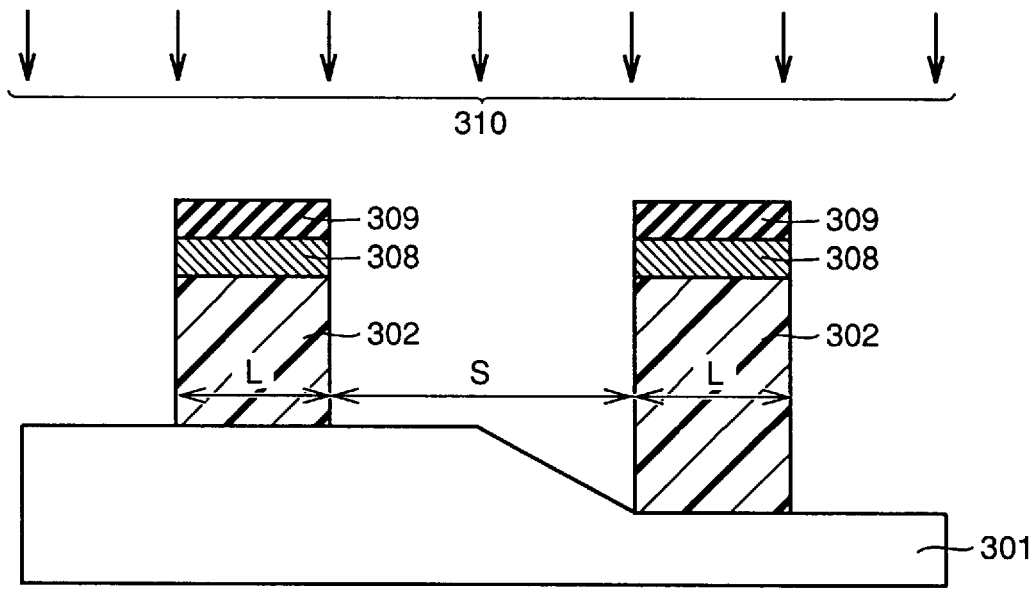
Figure 61:
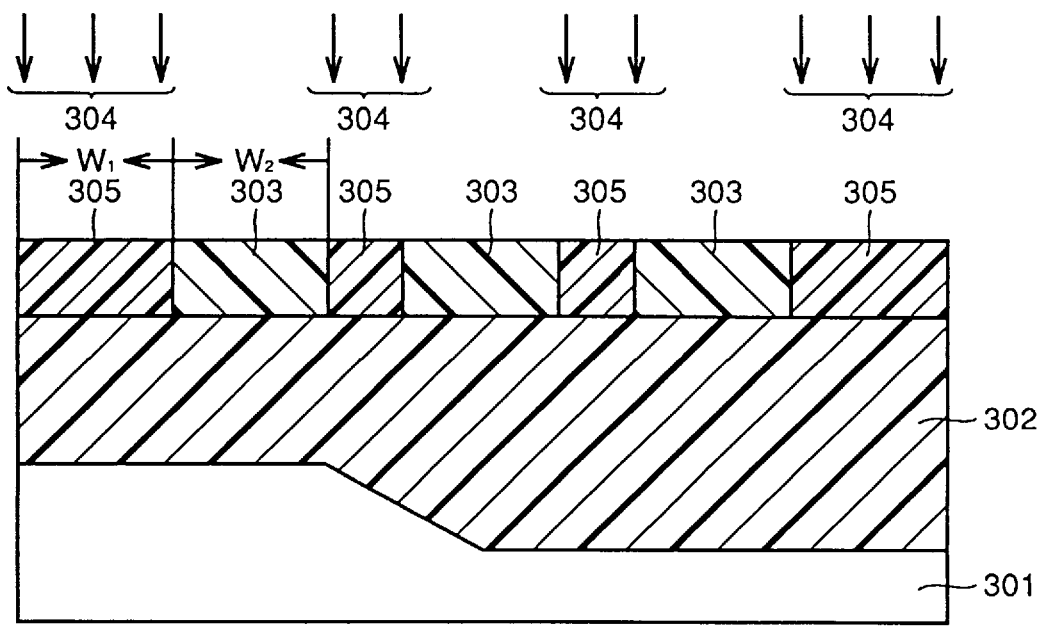
FIGS. 61 to 64 are cross sectional views respectively showing first to fourth steps of a conventional method of forming a fine pattern.
Figure 62:
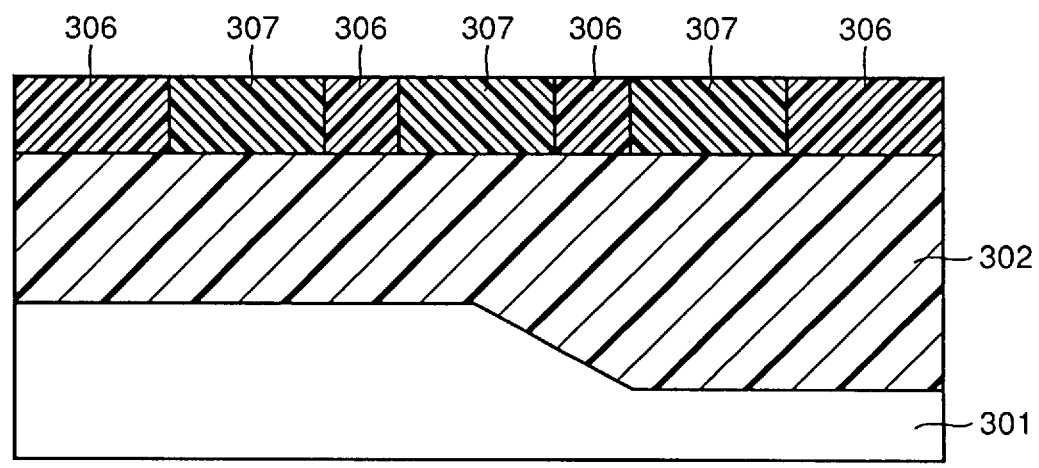
Figure 63:
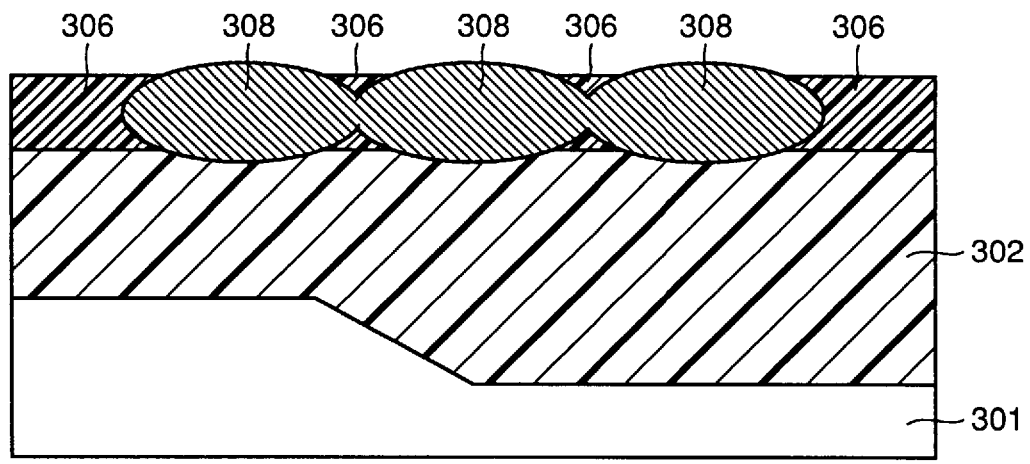
Figure 64:
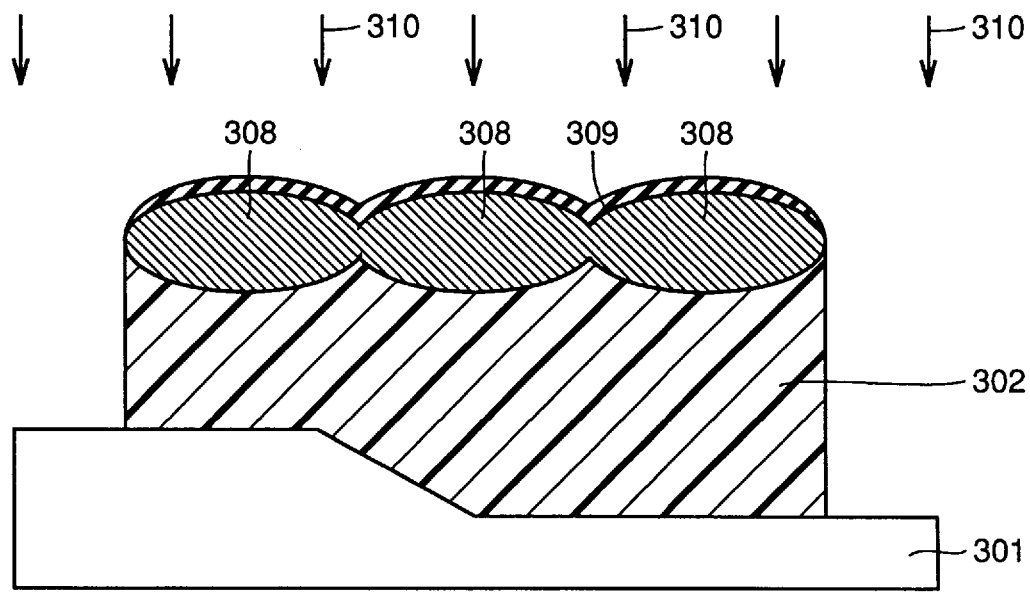
Figure 65:
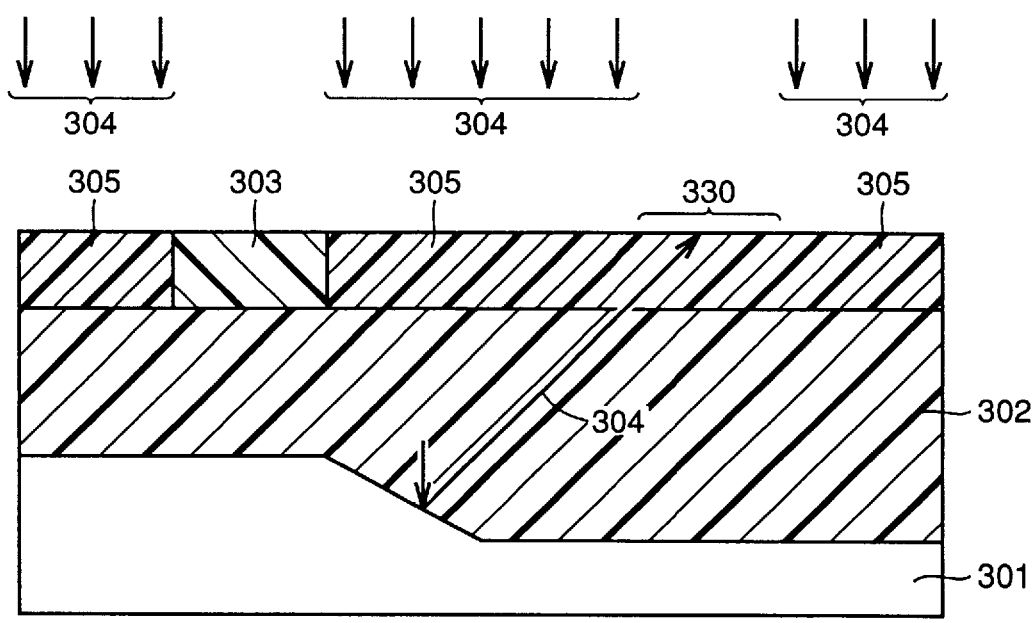
FIG. 65 is a cross sectional view used for illustration of reflection (halation) of light from a stepped portion in a layer to be processed.

Referring to FIG. 54, it can be seen that resolution is suddenly degraded when a thickness (T) of upper resist layer 103 is less than 30 nm. It can be considered that this is because upper resist layer 103 is too thin and silylated layer 108 is therefore thin and is etched during dry etching.

Furthermore, it can be seen that resolution is degraded when the thickness of upper resist layer 103 is more than 100 nm. It can be considered that this is because upper resist layer 103 is thick and silylated layer 108 therefore swells at the time of silylation.

From the foregoing, it can be appreciated that an optimal thickness of upper resist layer 103 is in the range from 30 to 100 nm.

According to the present invention, since the thickness of the upper resist layer is kept so that the upper resist layer will not be etched by dry etching and swelling thereof can be suppressed, that is, kept in the range from 30 to 100 nm, a fine pattern can be formed with high accuracy.

In addition, since the lower resist layer is made to have light reflectance of at most 5%, light reflection from the lower resist layer can be prevented, so that a pattern can be formed without halation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a pattern, comprising the steps of:
   forming a first layer by applying an organic material on a layer to be processed;
   forming a second layer having a thickness in a range from 30 nm or more but less than 50 nm by applying a material which can be treated with an organic metal reagent on said first layer;
   selectively forming in said second layer a portion which cannot be treated with an organic metal reagent;
   treating with organic metal reagent said second layer except said portion which cannot be treated with an organic metal reagent; and
   removing said portion which cannot be treated with an organic metal reagent and a portion of said first layer which is located thereunder, wherein
      said step of selectively forming in said second layer a portion which cannot be treated with an organic metal reagent includes the steps of:
         selectively directing light to said second layer, and turning a portion of said second layer which has been exposed to the light into a portion which cannot be treated with an organic metal reagent by heating said second layer.

2. The method of forming a pattern as recited in claim 1, wherein
   said material which can be treated with an organic metal reagent contains active hydrogen.

3. The method of forming a pattern as recited in claim 2, wherein
   said material which can be treated with an organic metal reagent contains at least one material containing a group selected from the group consisting of an OH group, a COOH group, an NH group and an SH group.

4. The method of forming a pattern as recited in claim 1, wherein
   said step of forming the second layer includes the step of forming a protective film which covers a surface of said second layer.

5. The method of forming a pattern as recited in claim 1, wherein
   said organic material has reflectance of at most 5% for said light.

6. A method of forming a pattern, comprising the steps of:
   forming a first layer by applying an organic material on a layer to be processed;
   forming a second layer having a thickness in a range from 30 nm or more but not exceeding 100 nm by applying a material which can be treated with an organic metal reagent on said first layer;
   selectively forming in said second layer a portion which cannot be treated with an organic metal reagent;
   treating with organic metal reagent said second layer except said portion which cannot be treated with an organic metal reagent; and
   removing said portion which cannot be treated with an organic metal reagent and a portion of said first layer which is located thereunder, wherein
      said step of selectively forming in said second layer a portion which cannot be treated with an organic metal reagent consists of the step of selectively directing light to said second layer to turn a portion of said second layer which has been exposed to the light into a portion which cannot be treated with an organic metal reagent.

7. The method of forming a pattern as recited in claim 6, wherein
   said step of turning a portion of said second layer into a portion which cannot be treated with an organic metal reagent includes the step of directing light to said second layer in inert gas.

8. The method of forming a pattern as recited in claim 6, wherein
   said material which can be treated with an organic metal reagent contains active hydrogen.

9. The method of forming a pattern as recited in claim 8, wherein
   said material which can be treated with an organic metal reagent contains at least one material containing a group selected from the group consisting of an OH group, a COOH group, an NH group and an SH group.

10. The method of forming a pattern as recited in claim 6, wherein
    an intensity of said light is at least 10 mJ/cm$^2$/pulse.

11. The method of forming a pattern as recited in claim 6, wherein
    said material which can be treated with an organic metal reagent has transmittance of at least 80% for said light.

12. A method of forming a pattern, comprising the steps of:
    forming a first layer by applying a first organic material on a layer to be processed;
    forming a second layer having a thickness in a range from 30 nm or more but less than 100 nm by applying a second organic material on said first layer;
    selectively forming in said second layer a portion which can be treated with an organic metal reagent;
    treating with an organic metal reagent said portion which can be treated with an organic metal reagent; and
    removing said second layer except said portion which can be treated with an organic metal reagent and a portion of said first layer which is located under said second layer except said portion which can be treated with an organic metal reagent, wherein said step of selectively forming in said second layer a portion which can be treated with an organic metal reagent includes the steps of:
  selectively directing light to said second layer to turn a portion of said second layer which has been exposed to the light into a portion which can be treated with an organic metal reagent, and
  turning said second layer except the portion which can be treated with an organic metal reagent into a portion which cannot be treated with an organic metal reagent by heating said second layer.

13. A method of forming a pattern, comprising the steps of:
  forming a first layer by applying a first organic material on a layer to be processed;
  forming a second layer having a thickness in a range from 30 nm or more but not exceeding 100 nm by applying a second organic material on said first layer;
  selectively forming in said second layer a portion which can be treated with an organic metal reagent;
  treating with an organic metal reagent said portion which can be treated with an organic metal reagent; and
  removing said second layer except said portion which can be treated with an organic metal reagent and a portion of said first layer which is located under said second layer except said portion which can be treated with an organic metal reagent, wherein
    said step of selectively forming in said second layer a portion which can be treated with an organic metal reagent includes the steps of:
      selectively directing light to said second layer, and
      turning a portion of said second layer which has been exposed to the light into a portion which can be treated with an organic metal reagent by heating said second layer.

14. A method of forming a pattern, comprising the steps of:
  forming a first layer by applying a first organic material on a layer to be processed;
  forming a second layer having a thickness in a range from 30 nm or more but not exceeding 100 nm by applying a second organic material on said first layer;
  selectively forming in said second layer a portion which can be treated with an organic metal reagent;
  treating with an organic metal reagent said portion which can be treated with an organic metal reagent; and
  removing said second layer except said portion which can be treated with an organic metal reagent and a portion of said first layer which is located under said second layer except said portion which can be treated with an organic metal reagent, wherein
    said step of selectively forming in said second layer a portion which can be treated with an organic metal reagent includes the steps of:
      turning entire said second layer into a layer which can be treated with an organic metal reagent, and
      selectively directing light to said second layer which can be treated with an organic metal reagent to turn a portion of said second layer which has been exposed to the light into a portion which cannot be treated with an organic metal reagent.

15. The method of forming a pattern as recited in claim 14, wherein
  said step of turning a portion of said second layer which has been exposed to the light into a portion which cannot be treated with an organic metal reagent includes the step of selectively directing light to said second layer in inert gas.

16. The method of forming a pattern as recited in claim 14, wherein
  said step of turning entire said second layer into a layer which can be treated with an organic metal reagent includes the step of directing ultraviolet rays to entire said second layer.

* * * * *